United States Patent
Van Dijk et al.

(10) Patent No.: US 11,910,541 B2
(45) Date of Patent: Feb. 20, 2024

(54) FLEXIBLE DISPLAY WITH DISPLAY SUPPORT

(71) Applicant: SAMSUNG ELECTRONICS CO., LTD., Suwon-si (KR)

(72) Inventors: Robert Sjang Josine Van Dijk, Eindhoven (NL); Volker Barnhart Verschoor, Eindhoven (NL); Johannes Cornelis Adriaan Hamers, Eindhoven (NL); Michael Johannes Anna Maria Walters, Eindhoven (NL); Rik Kruidhof, Eindhoven (NL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/843,753

(22) Filed: Jun. 17, 2022

(65) Prior Publication Data

US 2022/0322543 A1 Oct. 6, 2022

Related U.S. Application Data

(63) Continuation of application No. 14/956,323, filed on Dec. 1, 2015, now Pat. No. 11,406,026, which is a
(Continued)

(51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1652* (2013.01); *G06F 1/1681* (2013.01);
(Continued)

(58) Field of Classification Search
CPC ...................................................... G06F 1/1652
(Continued)

(56) References Cited

U.S. PATENT DOCUMENTS

| | | | |
|---|---|---|---|
| 6,377,324 B1* | 4/2002 | Katsura | G06F 1/1643 349/58 |
| 6,577,496 B1* | 6/2003 | Gioscia | H04M 1/0216 455/344 |

(Continued)

FOREIGN PATENT DOCUMENTS

| | | |
|---|---|---|
| CN | 1247618 A | 3/2000 |
| CN | 1383503 A | 12/2002 |

(Continued)

OTHER PUBLICATIONS

Communication dated Jun. 15, 2022 by the European Patent Office in corresponding European Application No. 20216976.9.
(Continued)

*Primary Examiner* — Rockshana D Chowdhury
*Assistant Examiner* — Douglas R Burtner
(74) *Attorney, Agent, or Firm* — Sughrue Mion, PLLC

(57) ABSTRACT

A display device includes a flexible display and a support frame. The flexible display includes a first portion, a second portion, and a third portion there between. The support frame includes a first display support supporting the first portion, a second display support supporting the second portion, and a third display support supporting the third portion. The third display support is connected to the first display support and the second display support. The first display support and the second display support are rotatably connected between a configuration for maintaining the flexible display in a closed position and a configuration for maintaining the flexible display in an open position. The third display support includes a panel movable according to
(Continued)

the rotation of the first display support and the second display support, such that the panel contacts the third portion of the flexible display in an open position of the flexible display.

5 Claims, 26 Drawing Sheets

Related U.S. Application Data continuation of application No. 13/545,872, filed on Jul. 10, 2012, now Pat. No. 9,235,239.

(60) Provisional application No. 61/506,177, filed on Jul. 11, 2011.

(51) Int. Cl.
    *H04M 1/02* (2006.01)
    *G09F 9/30* (2006.01)
    *H05K 5/02* (2006.01)

(52) U.S. Cl.
    CPC .......... *G09F 9/301* (2013.01); *H04M 1/0268* (2013.01); *H05K 5/0226* (2013.01)

(58) Field of Classification Search
    USPC .................................. 361/679.21–679.3, 749
    See application file for complete search history.

(56) References Cited

U.S. PATENT DOCUMENTS

| | | | |
|---|---|---|---|
| 6,798,649 B1* | 9/2004 | Olodort | G06F 1/1618 345/905 |
| 7,032,984 B2 | 4/2006 | Kim et al. | |
| 7,311,366 B2 | 12/2007 | Kim et al. | |
| 7,765,644 B2 | 8/2010 | Ueyama et al. | |
| 8,151,501 B2 | 4/2012 | Bemelmans et al. | |
| 8,369,075 B2 | 2/2013 | Huang | |
| 8,654,519 B2* | 2/2014 | Visser | G09F 11/30 361/679.21 |
| 9,019,696 B2* | 4/2015 | Hamers | G06F 1/1652 361/679.55 |
| 9,086,850 B2* | 7/2015 | Verschoor | H04M 1/0268 |
| 9,459,656 B2* | 10/2016 | Shai | G06F 1/1641 |
| 10,104,787 B2* | 10/2018 | Rothkopf | G06F 1/1681 |
| 11,406,026 B2* | 8/2022 | Van Dijk | H05K 5/0226 |
| 2002/0104769 A1 | 8/2002 | Kim et al. | |
| 2003/0124992 A1* | 7/2003 | Riddiford | G06F 1/1616 455/90.1 |
| 2006/0050169 A1* | 3/2006 | Misawa | G06F 1/1698 348/333.06 |
| 2006/0138913 A1 | 6/2006 | Kim et al. | |
| 2006/0146488 A1* | 7/2006 | Kimmel | G09F 9/301 361/679.04 |
| 2007/0285337 A1 | 12/2007 | Maddock | |
| 2008/0158795 A1* | 7/2008 | Aoki | H04M 1/7246 361/679.27 |
| 2008/0204367 A1* | 8/2008 | Lafarre | H04M 1/0268 345/55 |
| 2009/0267872 A1 | 10/2009 | Silverbrook | |
| 2010/0064564 A1* | 3/2010 | Bemelmans | G06F 1/1601 40/607.01 |
| 2010/0164837 A1 | 7/2010 | Kao et al. | |
| 2010/0164838 A1 | 7/2010 | Kao et al. | |
| 2010/0208417 A1* | 8/2010 | Visser | H04M 1/0268 361/679.01 |
| 2010/0246103 A1* | 9/2010 | Visser | H04M 1/0216 361/679.01 |
| 2010/0289730 A1* | 11/2010 | Aoki | H04M 1/7246 361/679.01 |
| 2010/0321275 A1 | 12/2010 | Hinckley et al. | |
| 2011/0043976 A1* | 2/2011 | Visser | G09F 9/301 361/679.01 |
| 2011/0140995 A1* | 6/2011 | Hamers | G09F 9/301 345/30 |
| 2011/0227822 A1* | 9/2011 | Shai | G06F 1/169 345/156 |
| 2012/0033354 A1 | 2/2012 | Huang | |
| 2012/0236484 A1 | 9/2012 | Miyake | |
| 2012/0243206 A1 | 9/2012 | Wang et al. | |
| 2012/0307423 A1* | 12/2012 | Bohn | H04M 1/0216 361/679.01 |
| 2013/0002114 A1* | 1/2013 | Hamers | G06F 1/1681 312/326 |
| 2013/0010405 A1* | 1/2013 | Rothkopf | G06F 1/1652 361/679.01 |
| 2013/0021762 A1* | 1/2013 | van Dijk | H04M 1/022 361/749 |
| 2013/0037228 A1* | 2/2013 | Verschoor | G06F 1/1652 160/377 |
| 2014/0042293 A1* | 2/2014 | Mok | H04M 1/0216 248/682 |
| 2016/0352878 A1* | 12/2016 | Kim | G06F 1/1626 |
| 2022/0147103 A1* | 5/2022 | Cheng | G06F 1/1681 |

FOREIGN PATENT DOCUMENTS

| | | |
|---|---|---|
| CN | 1114898 C | 7/2003 |
| CN | 1744803 A | 3/2006 |
| CN | 101453854 A | 6/2009 |
| CN | 101573879 A | 11/2009 |
| CN | 101681183 A | 3/2010 |
| CN | 101952788 A | 1/2011 |
| DE | 20 2010 008706 U1 | 1/2011 |
| EP | 1 635 313 A2 | 3/2006 |
| EP | 1 785 805 A2 | 5/2007 |
| EP | 2546720 A2 | 1/2013 |
| GB | 635144 A | 4/1950 |
| JP | 9-230503 A | 9/1997 |
| JP | 11-15397 A | 1/1999 |
| WO | 03073247 A2 | 9/2003 |
| WO | 2006/038171 A1 | 4/2006 |
| WO | 2008/054206 A2 | 5/2008 |
| WO | 2008/083361 A1 | 7/2008 |
| WO | 2009/067013 A1 | 5/2009 |
| WO | WO-2009067010 A2 * | 5/2009 .......... G06F 1/1652 |
| WO | 2009/148313 A1 | 12/2009 |
| WO | 2010/019176 A1 | 2/2010 |
| WO | 2011/067921 A1 | 6/2011 |

OTHER PUBLICATIONS

Communication dated Apr. 23, 2021 by the European Patent Office in corresponding European Application No. 20216976.9.
Communication dated Aug. 17, 2018, from the European Patent Office in counterpart European Application No. 12175310.7.
Communication dated Feb. 1, 2021 by the China National Intellectual Property Administration in corresponding Chinese Application No. 201810628696.0.
Communication dated Feb. 18, 2019, issued by the European Patent Office in counterpart European Patent Application No. 12175310.7.
Communication dated Jan. 27, 2021 by the China National Intellectual Property Administration in corresponding Chinese Application No. 201810628678.2.
Communication dated Jul. 20, 2021, from The China National Intellectual Property Administration in Application No. 201810629469.X.
Communication dated Mar. 29, 2017, issued by the State Intellectual Property Office of P.R. China in counterpart Chinese Application No. 201210240844.4.
Communication dated Nov. 6, 2017, from the State Intellectual Property Office of People's Republic of China in counterpart Application No. 201210240844.
Communication dated Sep. 10, 2019 issued by the European Intellectual Property Office in counterpart European Application No. 12 175 310.7.

(56) References Cited

OTHER PUBLICATIONS

Communication dated Sep. 27, 2016 issued by the State Intellectual Property Office of P.R. China in counterpart Chinese Patent Application No. 201210240844.4.
Communication dated Jan. 13, 2022 by the China National Intellectual Property Administration in Chinese Patent Application No. 201810628678.2.
Communication dated Nov. 17, 2020 by the State Intellectual Property Office of P.R. China in counterpart Chinese Patent Application No. 201810629469.X.
Communication dated Nov. 2, 2021 by the China National Intellectual Property Administration in Chinese Patent Application No. 201810628696.0.
Communication received from the European Patent Office in corresponding European Patent Application No. 20 216 976.9-1224 dated Jun. 15, 2022.
Notice of Allowance issued in parent U.S. Appl. No. 14/956,323 dated Feb. 18, 2022.
Final Office Action issued in parent U.S. Appl. No. 14/956,323 dated Feb. 27, 2020.
Office Action issued in parent U.S. Appl. No. 14/956,323 dated Aug. 30, 2019.
Final Office Action issued in parent U.S. Appl. No. 14/956,323 dated Mar. 5, 2019.
Office Action issued in parent U.S. Appl. No. 14/956,323 dated Oct. 4, 2018.
Final Office Action issued in parent U.S. Appl. No. 14/956,323 dated Apr. 26, 2018.
Office Action issued in parent U.S. Appl. No. 14/956,323 dated Nov. 2, 2017.
Communication dated Apr. 5, 2023, issued by the European Patent Office in European Application No. 20 216 976.9.

* cited by examiner

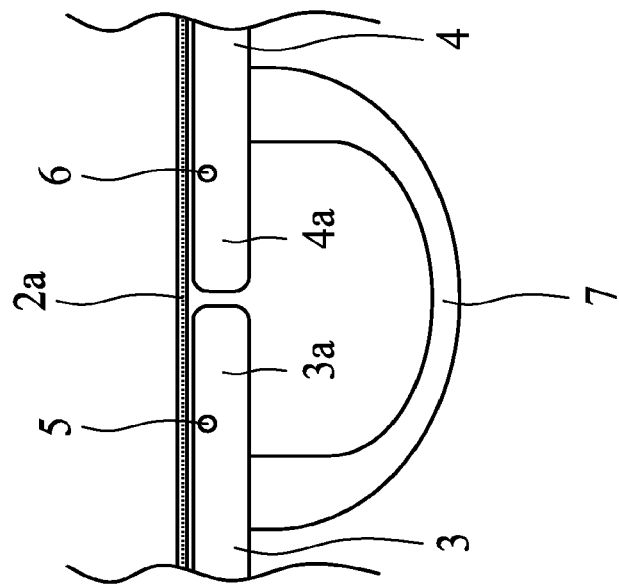
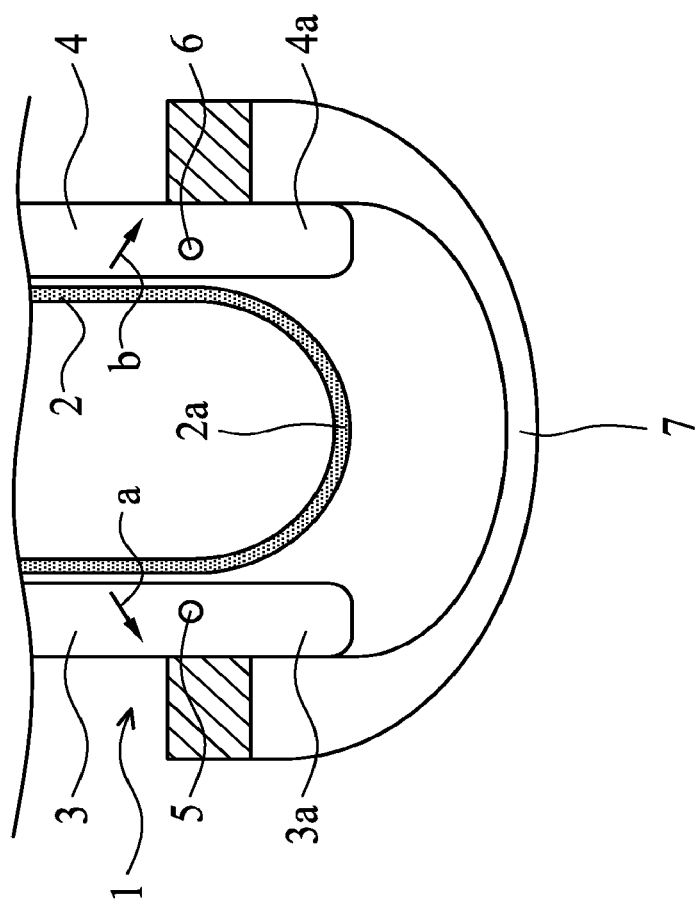
FIG. 1a
FIG. 1b

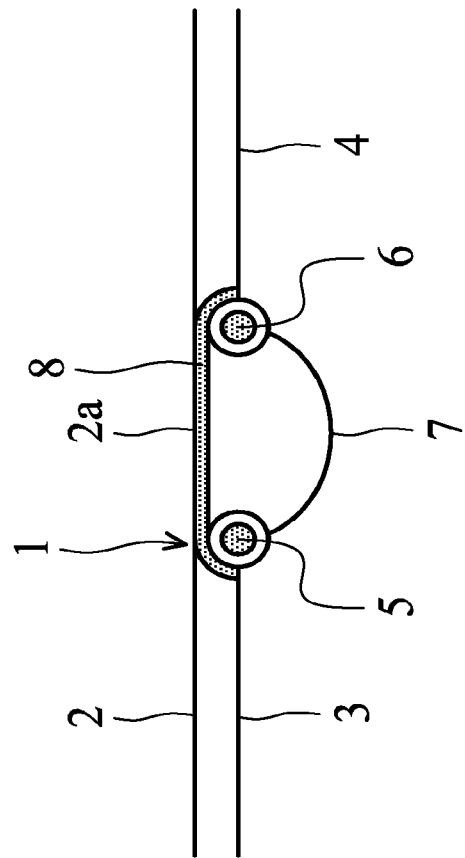
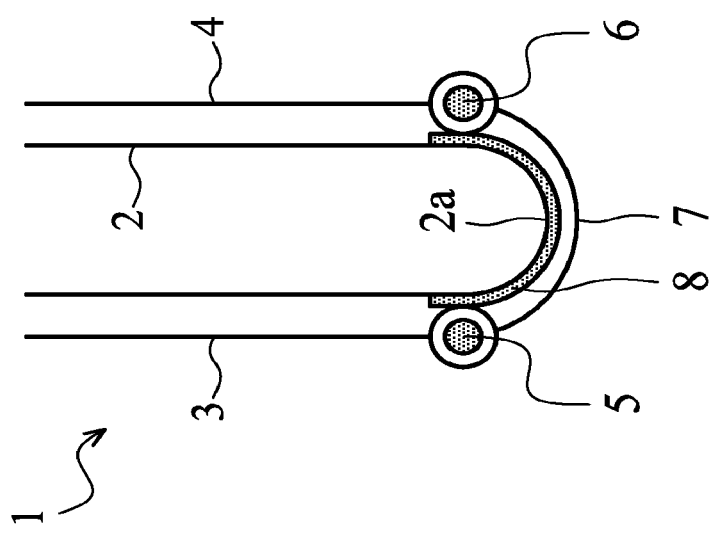

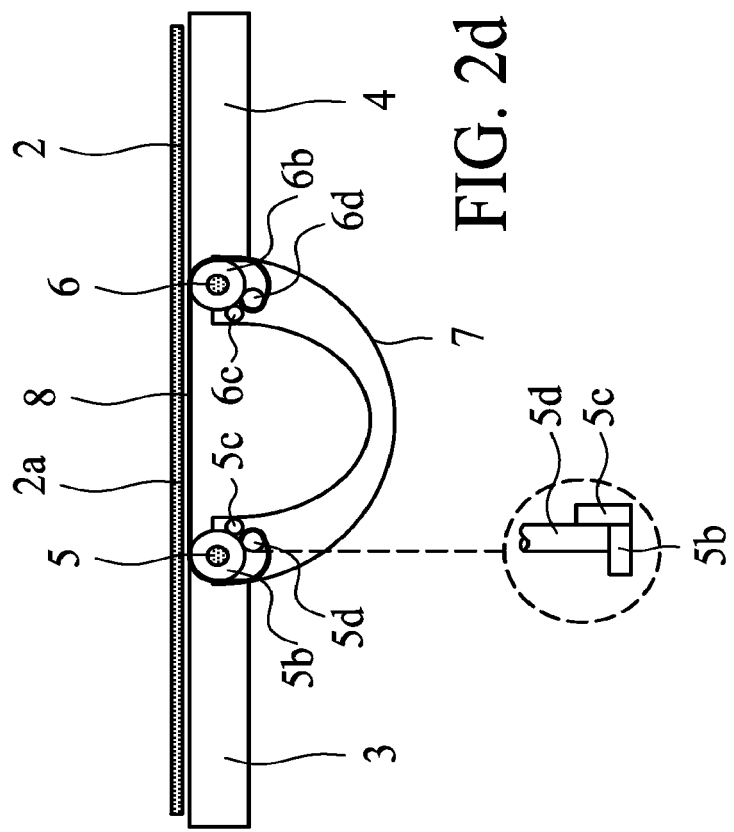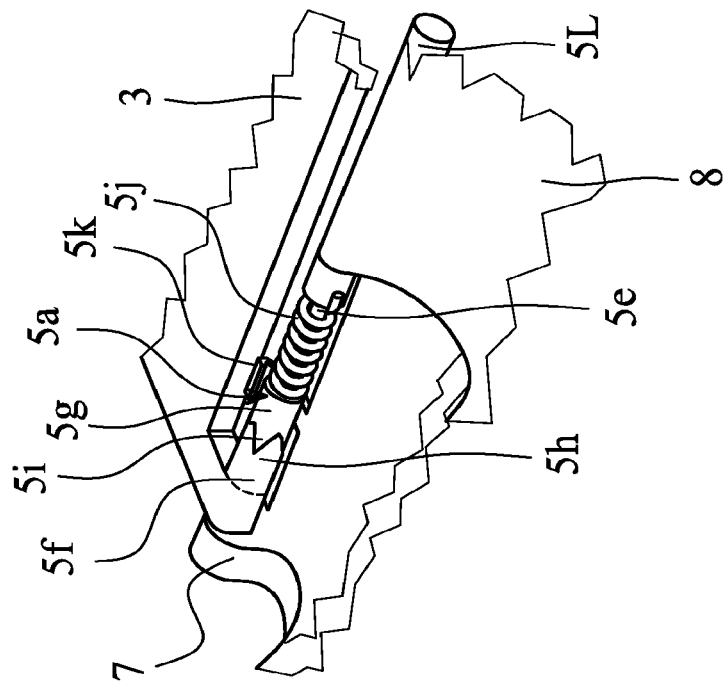

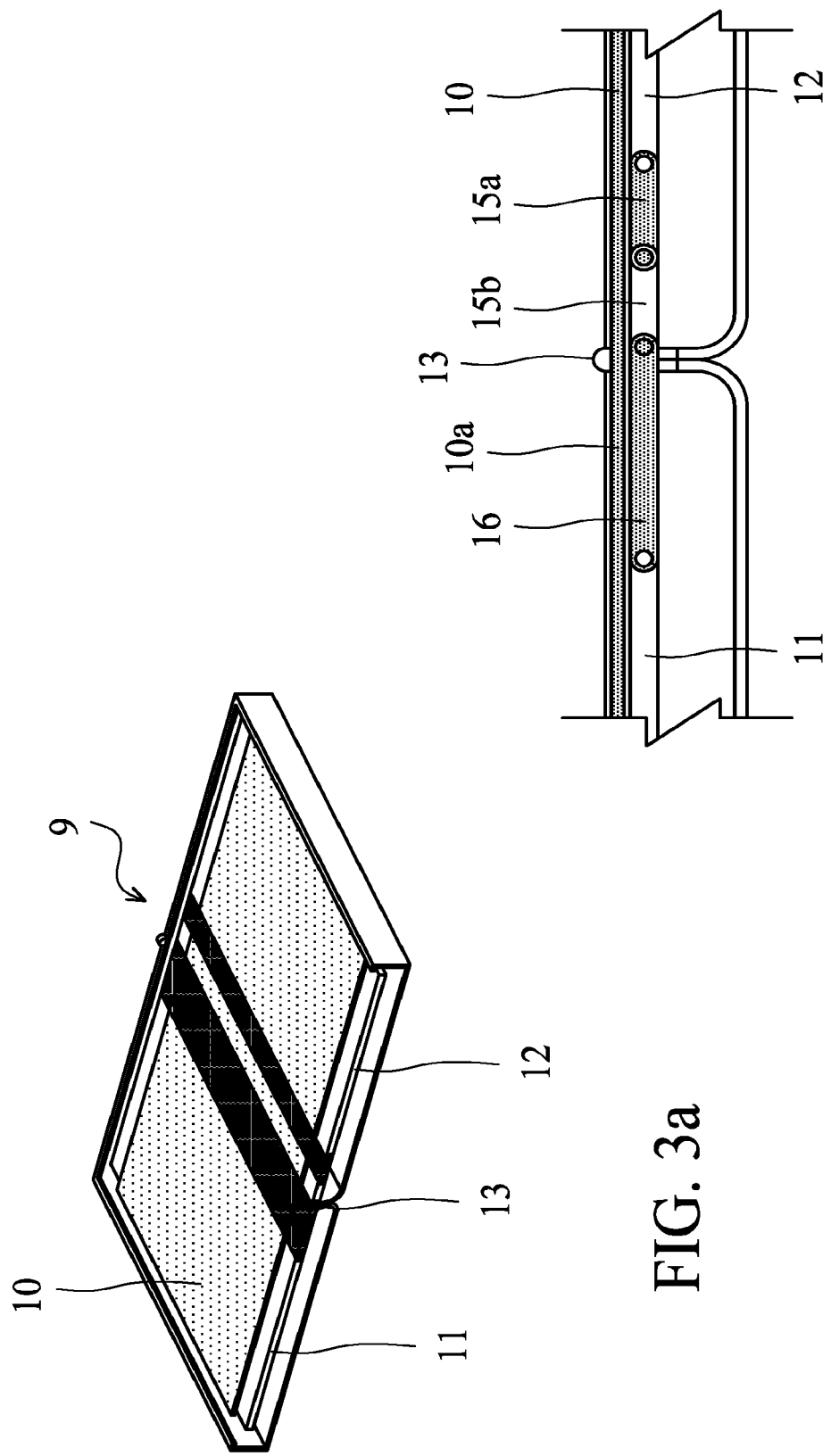

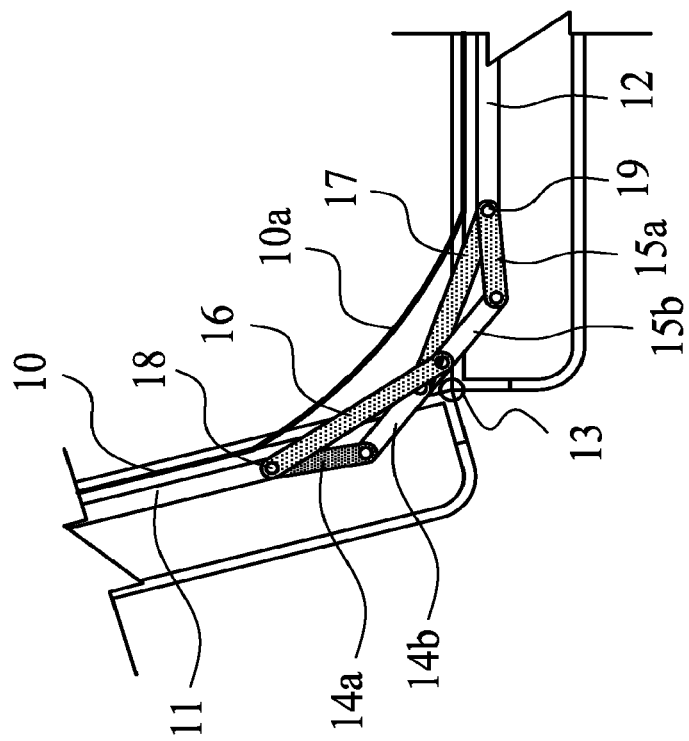
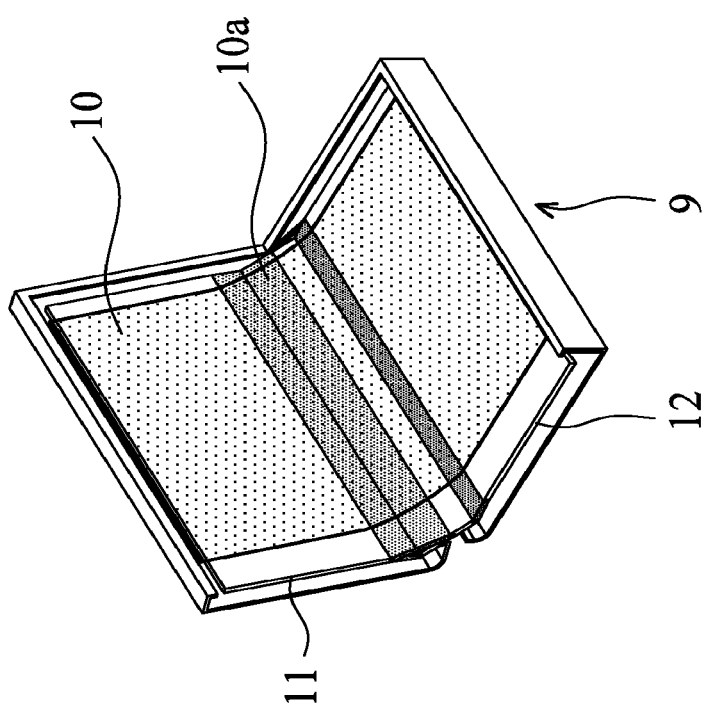
FIG. 3d
FIG. 3c

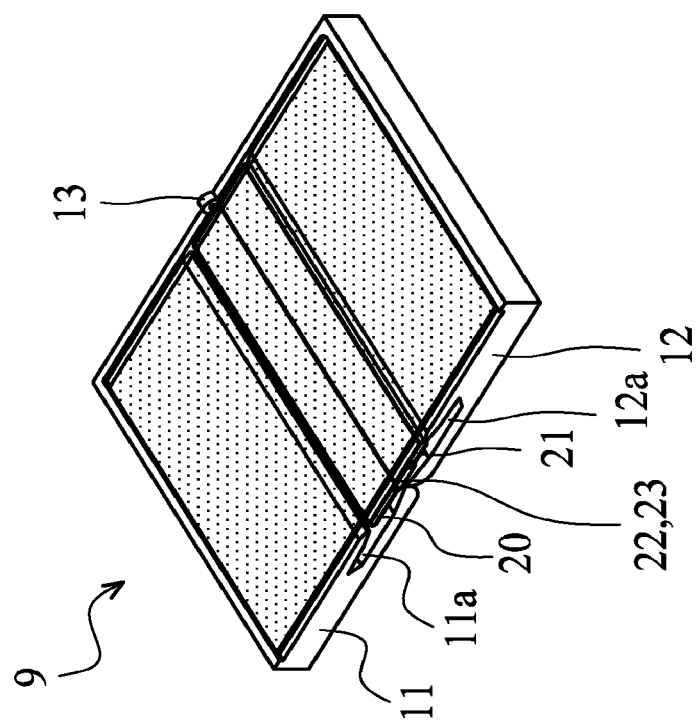
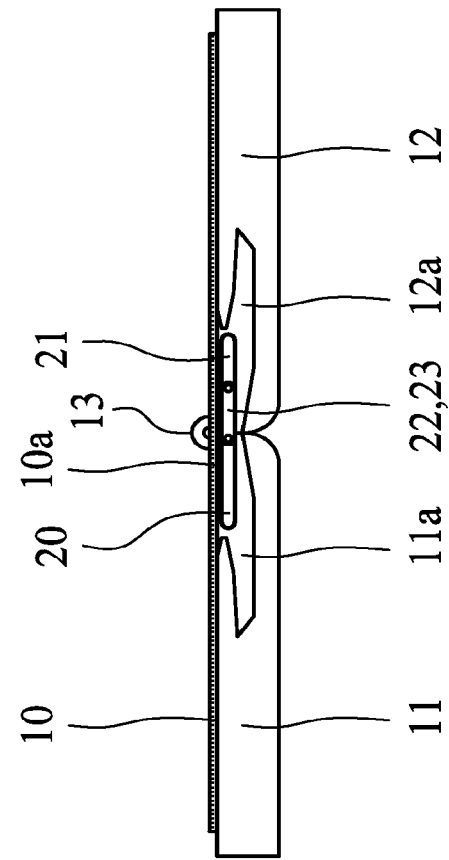
FIG. 4a
FIG. 4b

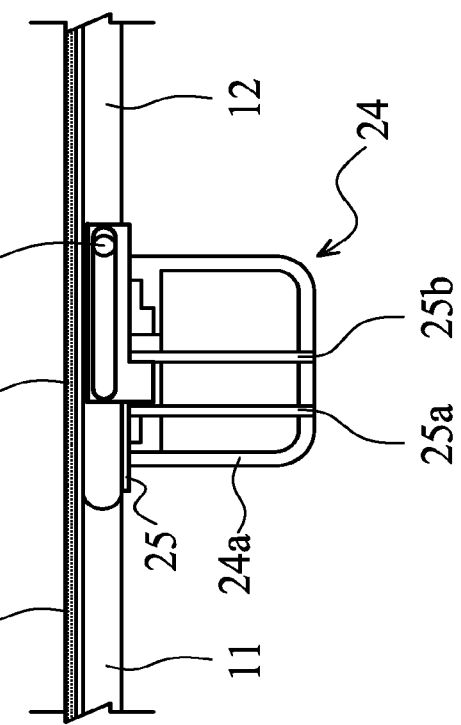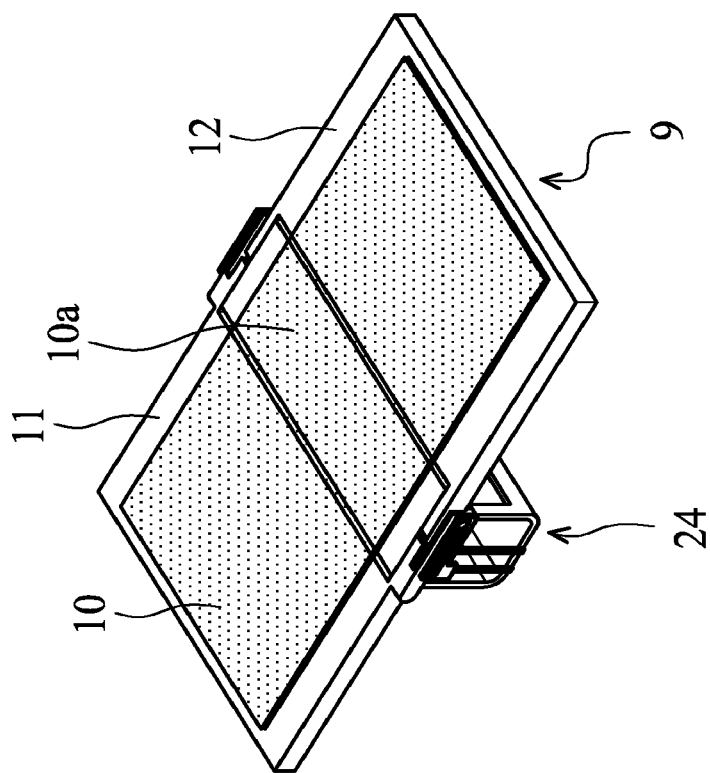
FIG. 5b
FIG. 5a

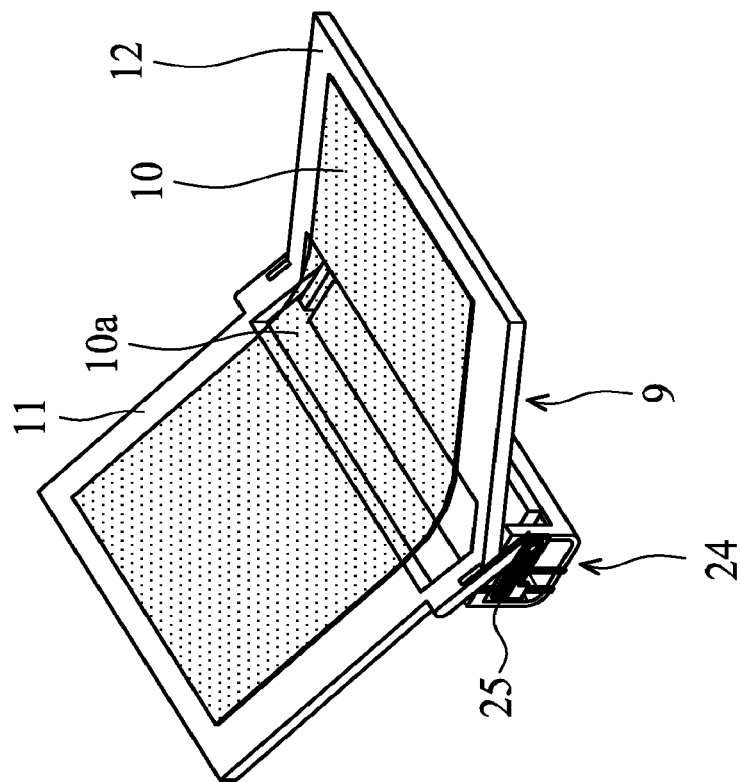
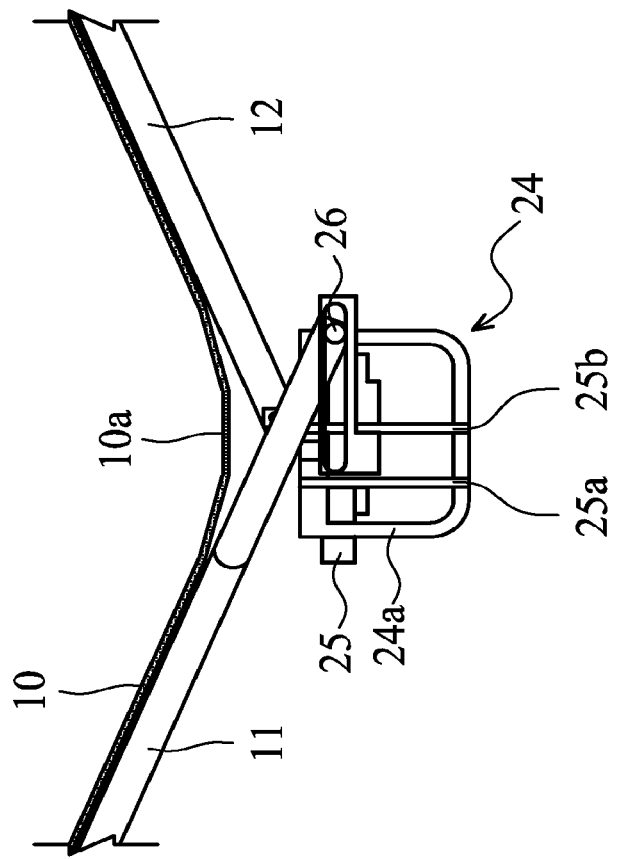
FIG. 5c
FIG. 5d

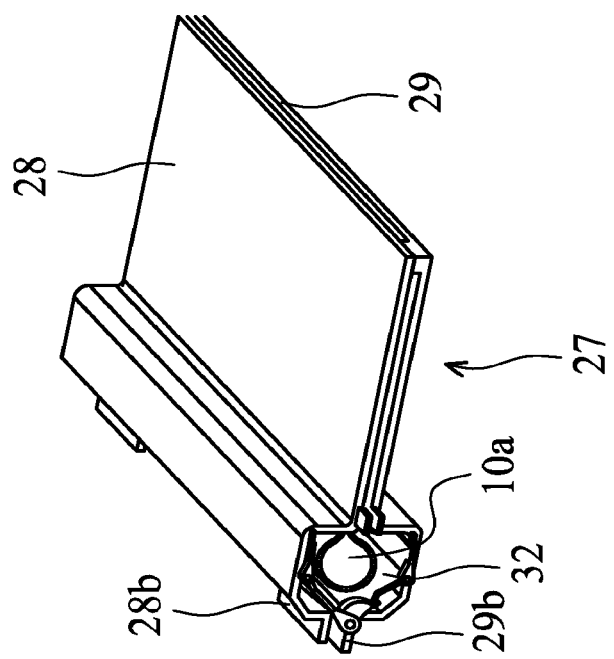
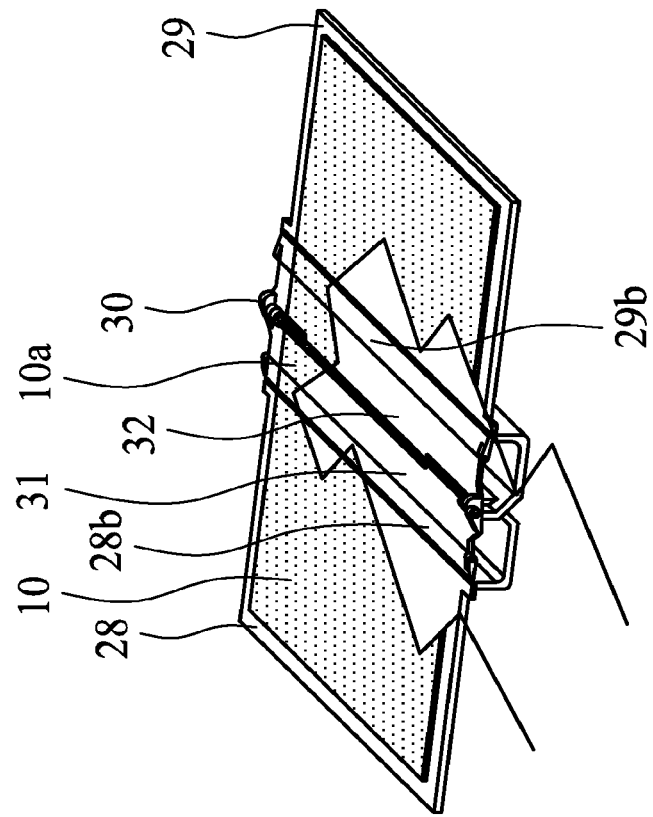
FIG. 7a
FIG. 7b

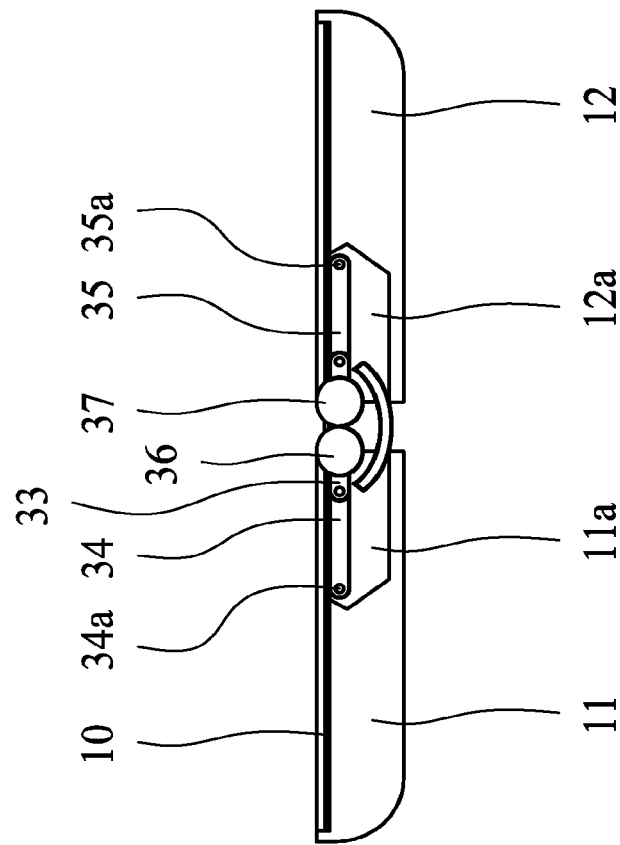
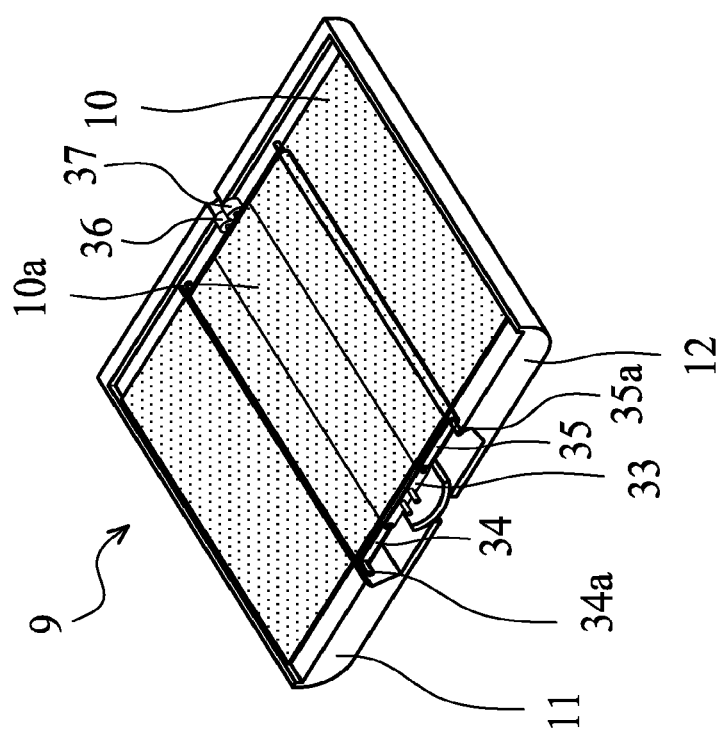
FIG. 9a
FIG. 9b

FLEXIBLE DISPLAY WITH DISPLAY SUPPORT

This application is a Continuation of U.S. application Ser. No. 14/956,323, filed on Dec. 1, 2015, which is a Continuation of U.S. patent application Ser. No. 13/545,872, filed on Jul. 10, 2012 (now U.S. Pat. No. 9,235,239), which claims the benefit of U.S. Provisional Application Ser. No. 61/506,177, filed on Jul. 11, 2011, which are hereby incorporated by reference in their entirety.

TECHNICAL FIELD

The present invention generally relates to flexible displays. The present invention specifically relates to flexible displays provided with display supports.

DESCRIPTION OF RELATED ART

Flexible and especially rollable displays are manufactured on an organic substrate and are very thin. This makes it possible to repeatedly bend them with a small radius, a requirement for a rollable display. The advantages of a rollable display are the small volume needed for storing in the closed position and the lack of glass making the display unbreakable and of light weight.

A number of product concepts have been developed for flexible displays. The most important concepts are the 'book', the 'wrap' and the 'roll'. A 'wrap' concept is shown in WO 2008/054206 A2, a 'roll' concept in WO 2006/038171 A1.

The 'book' concept is the simplest implementation of a rollable display comprising two hingeably connected support halves with a continuous display. In the middle near the hinge mechanism is a hollow space to accommodate the curved segment of the display in the situation where the 'book' is in the closed position. The display size is at most twice the size of the closed display system. In practice, it will be around 1.8× the size due to the bezel of the support halves needed around the display.

The 'wrap' concept comprises a display, wrapped with its front side to the inside. Thus the display is protected when the 'wrap' is in the closed position. The display currently makes one complete turn around the device body when wrapped. Therefore, the size of the display will be about twice the size of the device. For larger displays compared to the device body more turns are required, which adds mechanical complexity.

Instead of rolling the display around the device body, especially if it is more than one turn, it could also be rolled around a tube and stored inside the system. This 'roll' concept has a very different product experience, as the display comes out of the system instead of being wrapped around it.

There are a lot of possibilities to realize the movement of the display with respect to the display system, but most of them result in an open position with unsupported parts of the display. This can result in problems when touch functionality has to be integrated into the display. The pressure from a touch on the display can result in tearing of the display due to the tensions and it can result in imprints along the edges of the unsupported display part.

Another problem is that for the end-user it is important to have a consistent feeling of touch across the whole display. In an unsupported location, touching the display will feel different than in a supported location and this could be confusing to the end-user.

It is an object of the invention to prevent unsupported locations in the display in its open position. It is also an object to improve the lifetime of the display.

SUMMARY

According to one aspect the invention provides a display system comprising a continuous flexible display, a support frame comprising two main display supports being hingeable with respect to each other and each structurally configured to support a respective portion of the flexible display, wherein the two main display supports are hingeable between a configuration for fixing the flexible display in a closed storage position and a planar configuration for fixing the flexible display in an open position, wherein at least one additional display support is configured to support substantially a segment of flexible display located between the said respective portions of the flexible display in the open position, said additional display support being movable with respect to the display segment between a non-operational position and a support position when the two main display supports are moved between the storage position and the open position of the flexible display, such that in the open position substantially the whole surface of the display is supported by the respective display supports.

According to another aspect the invention provides a display system comprising a continuous flexible display and a display support device structurally configured to support the flexible display, wherein the display is movable between a closed storage position and an open position, wherein the display support device comprises at least one display support being movable between a storage position and a support position when the display is moved between the storage position and the open position of the flexible display, such that in the open position substantially the whole surface of the display is supported by the display support. This configuration of the display support is applicable for supporting different kinds of the flexible displays, i.e. of rollable, wrappable or of book type.

According to yet another aspect the invention provides a display system comprising a continuous flexible display, a support frame comprising two main display supports being hingeable with respect to each other and each structurally configured to support a respective portion of the flexible display, a segment of the flexible display being located between the said respective portions of the flexible display, wherein the two main display supports are hingeable between a closed configuration for fixing the flexible display in a storage position and an open configuration for fixing the flexible display in an open position, in the storage position of the flexible display between the main display supports and the additional display support there is a free space enabling a partial curvature of said display segment without conflicting with the respective main display support wherein at least one additional display support is configured to support substantially said segment of the flexible display in the storage position of the flexible display, the additional display support facilitates the curvature of the display segment with a predefined curvature.

According to another aspect the invention provides a display system with a continuous flexible display, a support frame comprising two display supports located in respective housings being hingeable with respect to each other and each structurally configured to support a respective portion of the flexible display, a segment of the flexible display being located between the said respective portions of the flexible display, wherein the two display support housings are hingeable between a closed configuration for fixing the flexible display in a storage position and an open configuration for fixing the flexible display in an open position, in the storage position of the flexible display between the display supports there is a free space enabling a partial curvature of said display segment without conflicting with the respective display support, wherein in the storage position the flexible display is positioned in the system with its display segment in an asymmetrical configuration with respect to a plane between both display support housings.

The invention focuses in the different embodiments on the support of the display in parts of the construction where the display cannot be connected to a rigid underground. This can be the case near hinges, guiding mechanisms and other mechanical elements that facilitate the movement of the display and supporting frame between a closed storage and an open position. The invention provides technical solutions for applying touch functionality in a display system with a flexible/rollable display.

The advantages of the different embodiments are that in the open position the display is supported by an additional support when touched. This means that it is less likely to be damaged when touch functionality is added to the display. Another advantage is that the display will feel stiffer and gives a better quality perception of the product. The predefined curvature of the display segment in the closed position is advantageous for the lifetime of the display.

BRIEF DESCRIPTION OF THE DRAWINGS

FIGS. 1A-1B show a schematic side view of part of a first 'wrap' embodiment in a storage position (FIG. 1A) and an operational position (FIG. 1B), respectively, in accordance with the invention;

FIGS. 2A-2E show a schematic side view of part of a second 'wrap' embodiment in a storage position (FIG. 2A) and an operational position (FIG. 2B), respectively, in accordance with the invention; FIG. 2C shows in a storage position a solution with a gear coupling between the display supports, applied in a wrap hinge of this embodiment, whereas FIG. 2D, FIG. 2E show another gear coupled solution applied in the wrap hinges of this embodiment in accordance with the invention;

FIGS. 3A-3I show a perspective view and a schematic side view of a first 'book' embodiment in an open position (FIGS. 3A/B), a partial open position (FIGS. 3C/D) and a storage position (FIGS. 3E/F), respectively, and a schematic side view of this 'book' embodiment with display supports with one and two hinges respectively in a symmetrical (FIG. 3G), a first asymmetrical (FIG. 3H) and a second asymmetrical (FIG. 3I) version in accordance with the invention;

FIGS. 4A-4F show a perspective view and a schematic side view of a second 'book' embodiment in an open position (FIGS. 4A/B), a partial open position (FIGS. 4C/D) and a storage position (FIGS. 4E/F), respectively, in accordance with the invention;

FIGS. 5A-5F show a perspective view and a schematic; side view of a third 'book' embodiment in an open position (FIGS. 5A/B), a partial open position (FIGS. 5C/D) and a storage position (FIGS. 5E/F), respectively, in accordance with the invention;

FIGS. 7A-7B show a perspective view of another 'book' embodiment in a storage position (FIG. 7A) and an open position (FIG. 7B), respectively, in accordance with the invention;

FIGS. 9A-9F show a perspective view and a schematic side view of another 'book' embodiment in an open position (FIGS. 9A/B), a partial open position (FIGS. 9C/D) and a storage position (FIGS. 9E/F), respectively, in accordance with the invention;

DESCRIPTION OF THE EMBODIMENTS

Figure 3E:
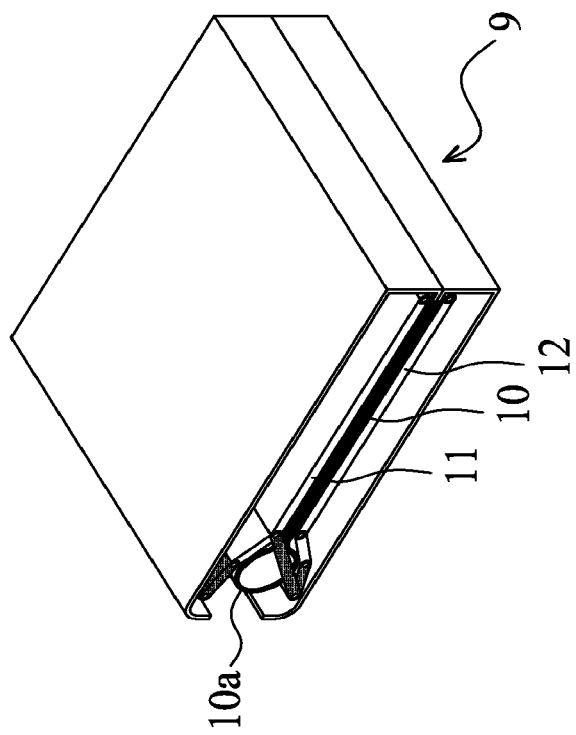

Reference is made to applicant's Provisional Application Ser. No. 61/506,180, filed on Jul. 11, 2011, which is hereby incorporated by reference.

The display system 1 schematically shown in FIGS. 1A and 1B is a 'wrap' embodiment as disclosed in WO 2008/054206 A2 (herewith incorporated by reference). It comprises a flexible display 2 and a display support frame comprising two main display supports 3, 4. These supports 3, 4 are connected via hinges 5, 6 with a body 7 and are each structurally configured to support a respective portion of the flexible display 2. At the other side of the respective hinge 5, 6 each of the display supports 3, 4 show an elongated portion configuring an additional display support 3a, 4a. The two main display supports 3, 4 are rotatable in the direction of arrows a, b between a configuration shown in FIG. 1A for fixing the flexible display in a closed storage position and a planar configuration shown in FIG. 1B for fixing the flexible display in an open position. The additional display supports 3a, 4a are moved with respect to a display segment 2a between a non-operational position and a support position when the two main display supports 3, 4 are moved between the storage position and the open position of the flexible display. The combined supports 3a, 4a support in the operational open position substantially the segment 2a of the flexible display located between the said respective main display supports. In the open position the gap created by the hinge mechanism of hinges 5, 6 between the main supports 3,4 is closed by the display supports 3a, 4a and substantially the whole surface of the display is supported.

In the storage position of the flexible display 2 between the main display supports 3,4 and the additional display supports 3a, 4a there is sufficient free space for enabling a partial curvature of the display segment 2a without conflicting with the respective main display supports.

In the open position between the hinges 5, 6 the display segment 2a is supported by the additional support 3a, 4a when touched. This means that damage of the display is prevented when touch functionality is added to the display. Another advantage is that sagging of the display is prevented. The display will feel stiffer which gives a better quality perception of the display system.

In FIGS. 2A-2E is schematically shown another 'wrap' embodiment. In this embodiment an additional display support is configured as a foil 8 which is attached to the hinges 5, 6 and at least partly tensioned in the support position of FIG. 2B, facilitating the support behind the whole surface of the display segment 2a in the open position of the flexible display 2. This will give a sufficient stiff underground for the display, enabling a touch functionality.

In the storage position of the flexible display 2 shown in FIG. 2A the foil 8 facilitates the curvature of the display segment 2a in a predefined way, in this embodiment shown as a combination of circular arches.

This well defined curvature is advantageous for the lifetime of the display. It enables opening/closing of the display system many times without damaging the display segment 2a. Another advantage of this curvature in the storage position is that the display system can be designed with favourable dimensions.

A sufficiently stiff underground for the display by using a foil 8 is obtained for example by rotating the main display supports 3, 4 around the hinges 5, 6 by more than 90 degrees, thus tensioning the foil 8. If (as shown in FIG. 2A, 2B) the main display supports 3, 4 rotate equal or less than 90 degrees, the foil 8 would have a travel difference that is smaller than that of the flexible display 2. This is solved in this embodiment by using a stretchable foil 8 as support of the display segment 2a.

In two alternative 'wrap' embodiments, respectively shown in FIG. 2C and in FIG. 2D, 2E, a gear-actuated solution in the mechanism of the hinges 5 and/or 6 is applied for enlarging the travel difference of the foil 8. In FIG. 2C a gear mechanism 5A is shown in the hinge 5, that can be compared with the mechanism in a ballpoint pen. An example of such a mechanism is disclosed in GB 635144 (herewith incorporated by reference). The mechanism 5A comprises a pin 5E of which the axis coincides with the axis of the hinge 5. Gears 5F and 5G are coaxially arranged around the pin 5E, such that gear 5F is connected with the support 3 whereas gear 5G, connected with the stretchable foil 8, is slidable and rotatable with respect to the pin 5E. In the gears a series of ratchet-like teeth 5H, 5I respectively is cut. The teeth 5I are continuously urged by a spring 5J located around the pin 5E in the direction of the teeth 5H and cooperate with the teeth 5H as the teeth of a gear-coupling. An abutment 5K limits the pivotal movement of the supports 3, 4 from the closed to the planar open position to 90 degrees. A shaft 5L is coaxially arranged around and connected with the pin 5E. The stretchable foil 8 is rolled with its end portion around the shaft 5L and is with its end connected with the shaft 5L. The cooperation of the inclined sides of the teeth 5H, 5I under the spring reaction ensures that the gear 5G and the shaft 5L rotate over an extra angle and thus tension the foil 8.

This 90 degrees rotation is by way of example. This gear solution shows the same favorable additional rotation with main display supports 3, 4 rotating by other angles of rotation.

In FIGS. 2D, 2E is shown another solution with gears 5B, C and 6B, C. The axis of gear 5B, 6B coincides with the hinge axis of hinge 5, 6 respectively. Due to the connection with the supports 3, 4 respectively, the gear 5B, 6B drives the intermediate gear 5C, 6C respectively during movement of the support. The intermediate gear 5C, 6C drives an axle 5D, 6D respectively, configured as a shaft. The stretchable foil S is rolled with its end portions around the shaft 5D and 6D and is with its ends connected to the shaft. The gear ratios between the gears 5A, 5B and the shaft 5D and between the gears 6A, 6B and the shaft 6D are chosen in accordance with the required amount of travel difference between the foil 8 and the flexible display 2, rotating the shaft 5D, 6D over an extra angle and thus tensioning the foil during the movement of the display from the closed to the planar open position.

Figure 3F:
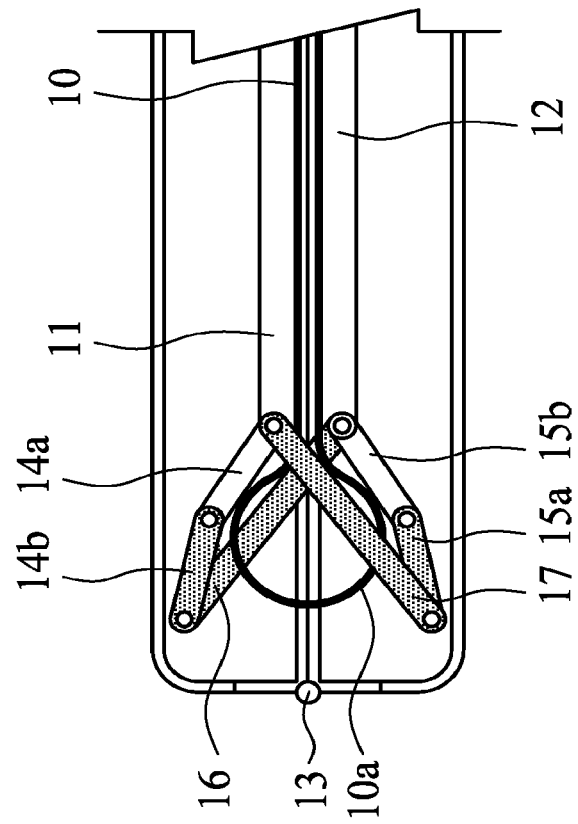
Figure 3G:
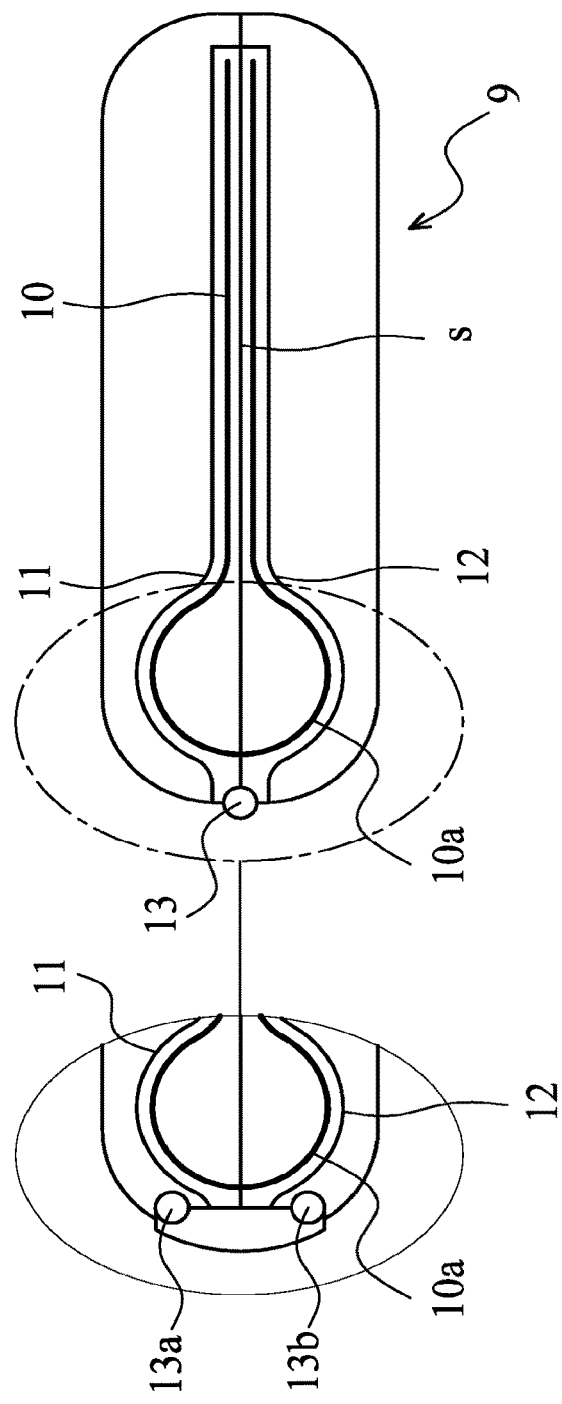

The embodiment shown in FIGS. 3A-3I is a 'book' display system 9. It consists of a flexible display 10 and a support frame, comprising two main display supports 11, 12 being connected by a hinge 13 with respect to each other and each structurally configured to support a respective portion of the flexible display. As shown in FIGS. 3A-3G, the two main display supports 11, 12 are hingeable between a configuration for fixing the flexible display in a closed storage position (FIGS. 3E and 3F) and a planar configuration (FIGS. 3A and 3B) for fixing the flexible display 10 in an open position. In this embodiment the additional display supports consist of four support panels 14a, 14b and 15a, 15b. See FIGS. 3D, 3F showing pairs of two mutually pivotable connected support panels 14a, 14b and 15a, 15b respectively, with the panels 14a and 15a pivotably connected by pivots 18, 19 with the display support 11,12 respectively. As shown in FIG. 3B the panels are being positioned under the display when the main display supports are opened. In this open state the support panels are "pulled flat" by bars 16, 17 (see FIG. 3D) at the respective sides of the display. With the panels 14a, 14b and 15a, 15b in the planar configuration as shown in FIGS. 3A and 3B, a segment 10a of flexible display, located between the said respective main display supports 11, 12 in the open position, is supported in an effective way. As shown in FIG. 3F in the closed storage position the pair of panels is positioned at both respective sides of the curved display segment 10a.

The embodiment of FIGS. 3A-3G is a symmetrical version of a 'book' in accordance with the invention with equally shaped housings of display support panels and in the storage position with a display, segment 10a symmetrically curved with respect to a plane s between both display supports 11, 12 and their housings.

Figure 3H:
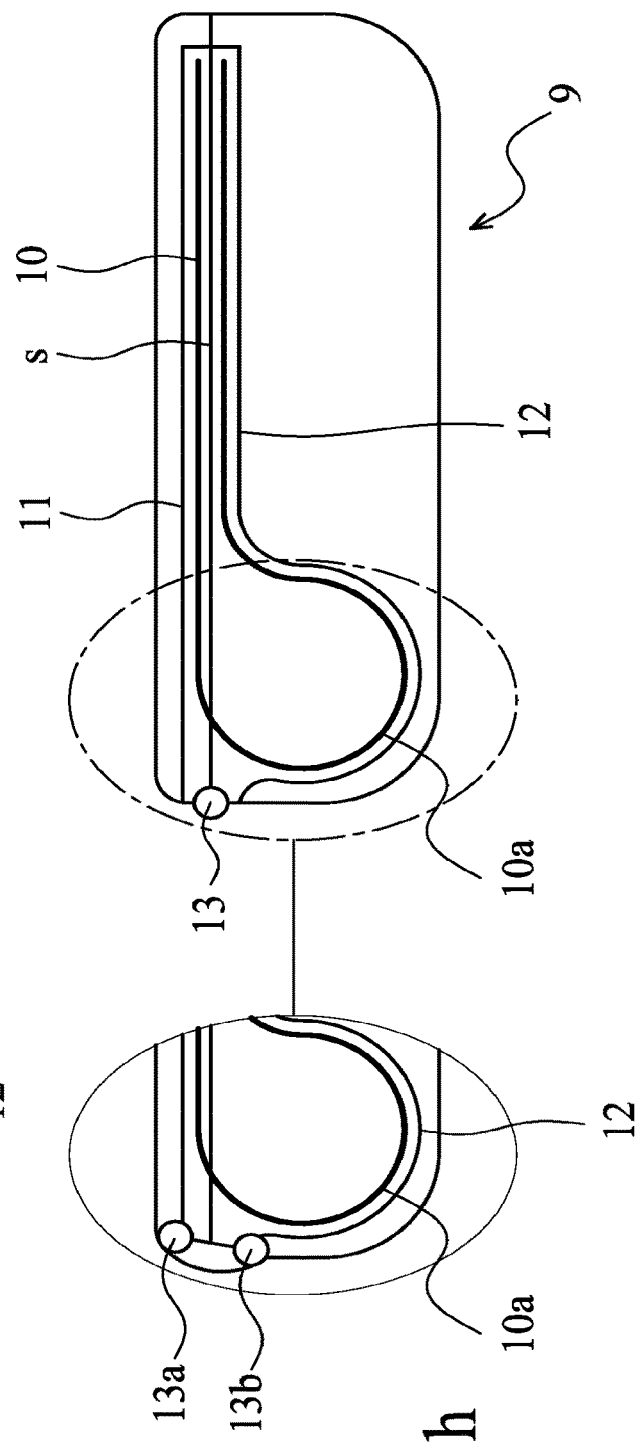
Figure 3I:
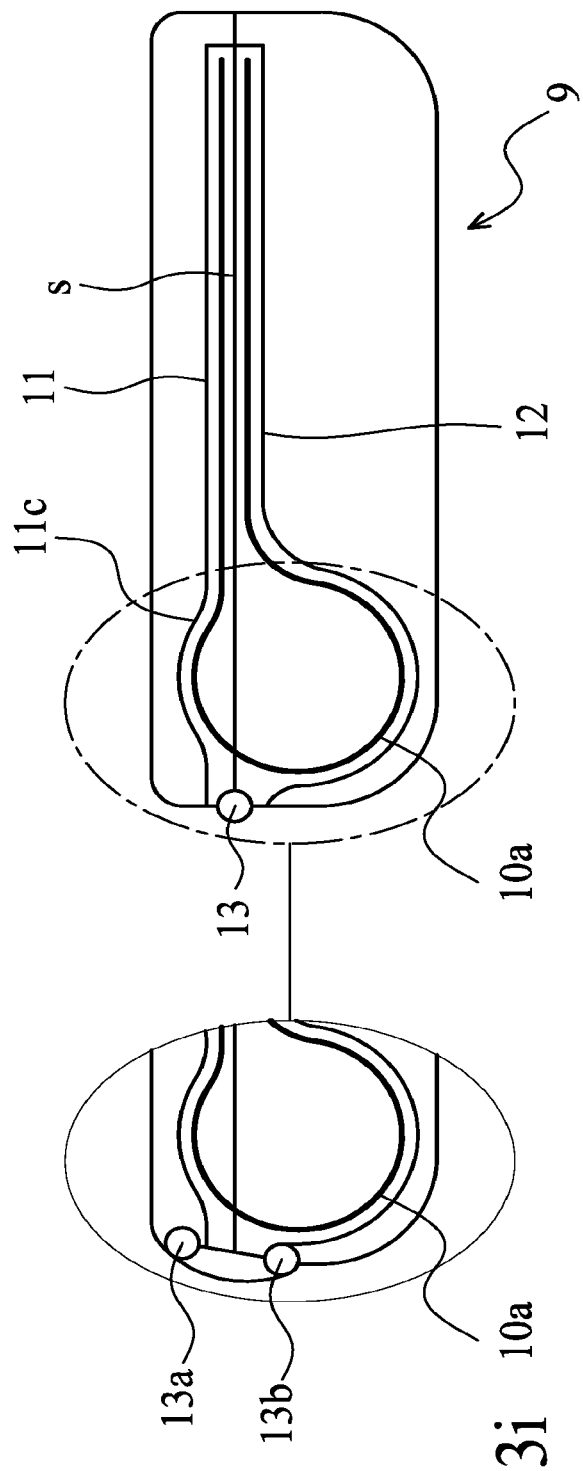

In FIG. 3H is shown an alternative version of this embodiment in accordance with the invention in the storage state, in which the display support housings have different dimensions measured perpendicular to the plane s between both display support housings. In the closed position the display segment is curved into the housing of the support 12. This solution can be applied in asymmetrical 'book' systems, in which the display segment 10a is asymmetrically curved with respect to the plane s between both display supports 11, 12 and their housings. A second asymmetrical version in accordance with the invention is shown in FIG. 3I with a curved profile 11c of the support 11. In the asymmetrical 'book' systems of FIGS. 3H and 3I the area of the flexible display 10 supported by the display support 12 in the opened position is larger than in the symmetrical 'book' system of FIG. 3G. Another advantage is that the lower book housing part with the support 12 is the housing part with a larger thickness, and thus has a higher volume and weight, enabling a stable positioning of the 'book' in the opened position in the hand or on a desk. As shown at the left side in FIGS. 3G, 3H and 3I in an alternative embodiment these versions of a 'book' are provided with display supports 11 and 12 with two hinges 13a, 13b. With the use of two hinges in the opened position the hinges are located favorable in the plane of the surface of the flexible display 10. Further the dimension of the display system 9 in the closed position (measured in the view of FIGS. 3G/3H from the left to the right side) is smaller compared to the dimension of the system with only one hinge 13.

Figure 4D:
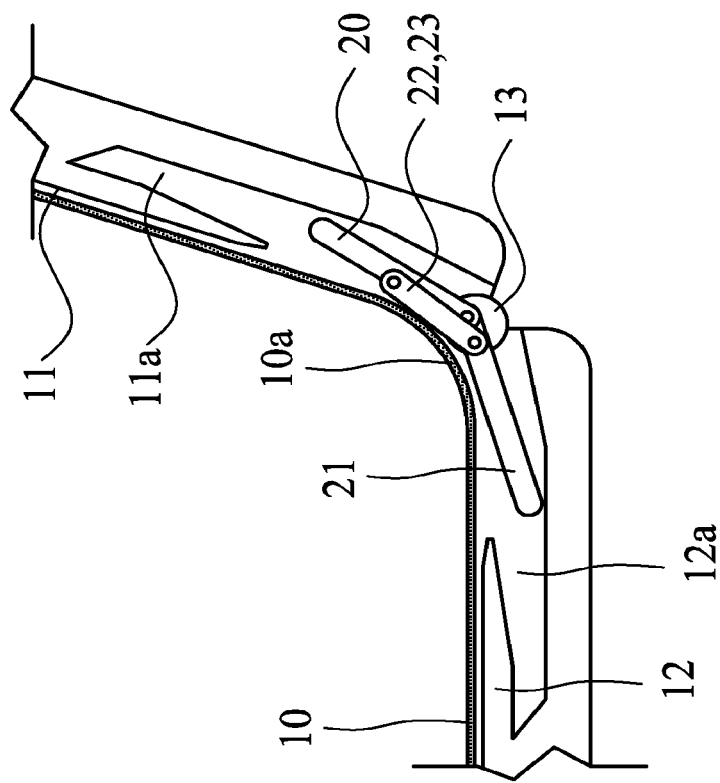
Figure 4C:
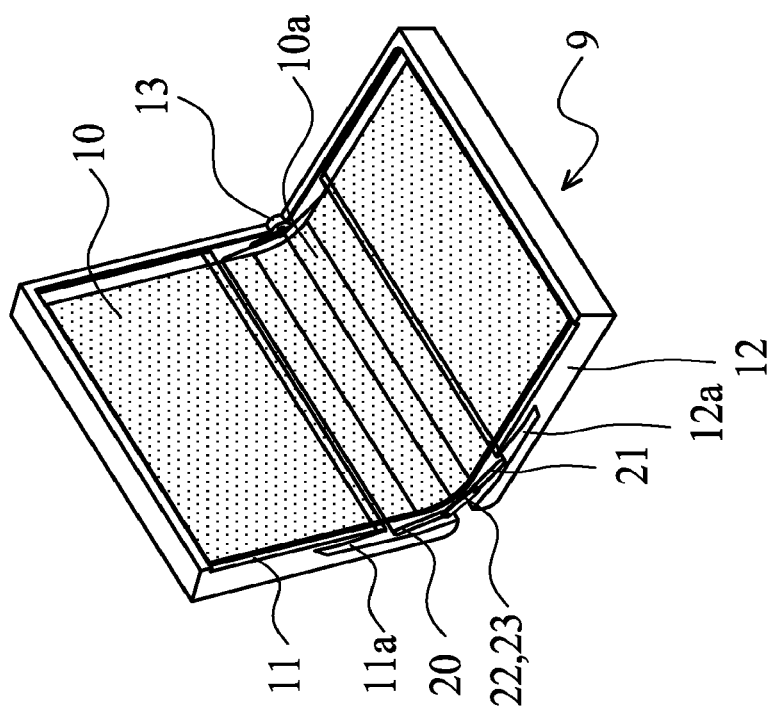
Figure 4F:
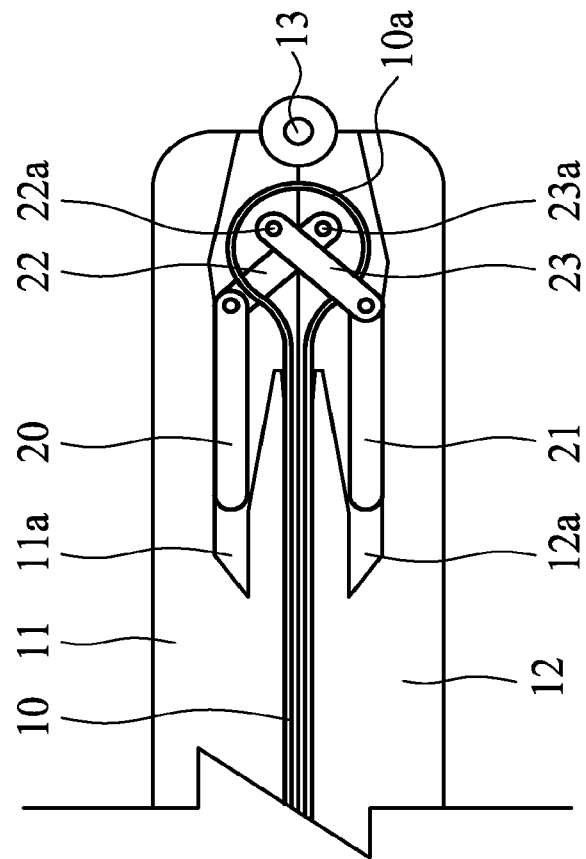
Figure 4E:
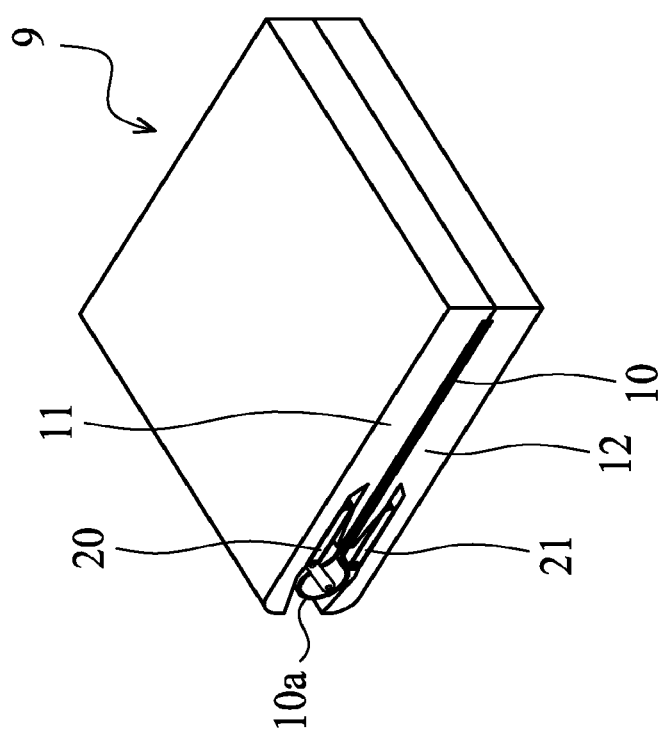
Figure 5F:
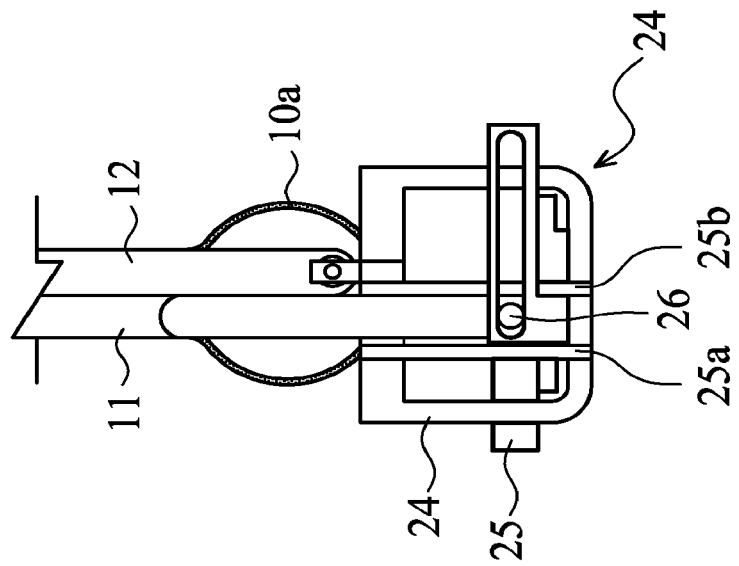
Figure 5E:
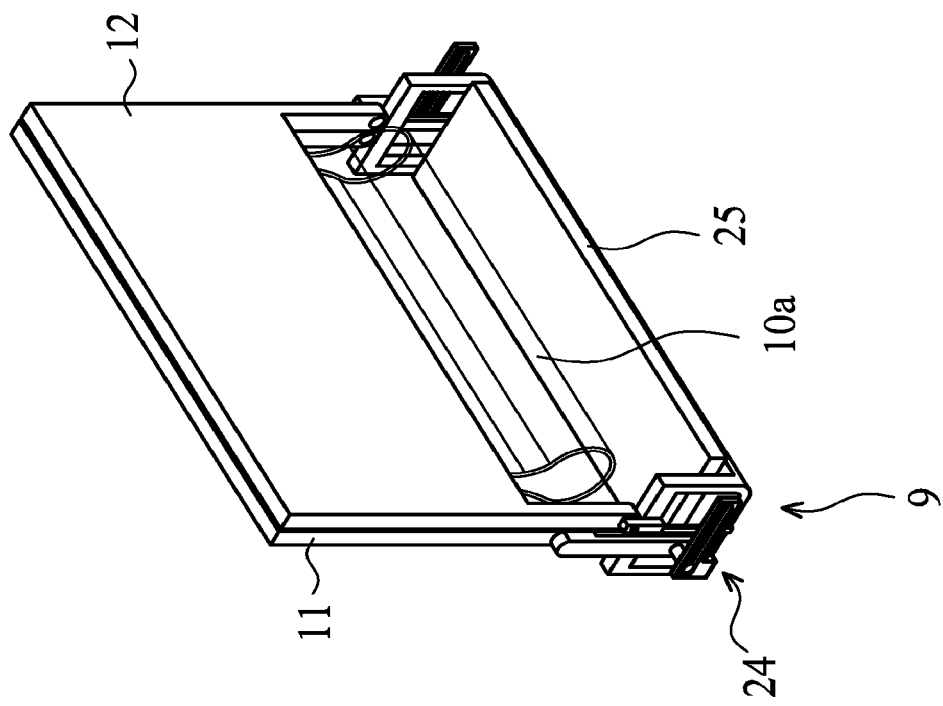

The embodiment shown in FIGS. 4A-4F is a 'book' display system 9 comparable with that of FIGS. 3A-3I but in FIGS. 4A-4F the additional display supports comprise two panels 20, 21 being guided slidably in slots 11a, 12a at both sides of the display support 11, 12. They slide with respect to the display segment 10a during movement of the flexible display 10 between the open position (FIGS. 4A, B) via the position shown in FIG. 4O, D to the closed storage position (FIG. 4E, F). In the position of FIG. 4A, B the panels 20, 21 are in a planar configuration for supporting the surface of the display segment 10a. As in the previous embodiment these panels 20, 21 are also pivotably connected respectively to an arm 22, 23 that is attached by pivots 22a, 23a respectively to the opposite main display support 11, 12 in order to enable the sliding movement during opening and closing of the system. As in the previous embodiment shown in FIG. 3H also this solution can be applied one-sided in an asymmetrical book.

The embodiment shown in FIGS. 5A-5F is a 'book' display system 9 provided with a lifting mechanism 24 comprising an additional display support that consists of a panel 25 that is lifted under the display segment 10a when the system is moved from the closed (FIGS. 5E, F) to the opened (FIGS. 5A, B) position. The lift panel 25 is constrained to a linear movement and is guided by a guiding element, comprising a protrusion 26 on the main display support 11 and parallel guiding walls 25a, 25b in a housing 24a of the lift mechanism 24.

Figure 6A:
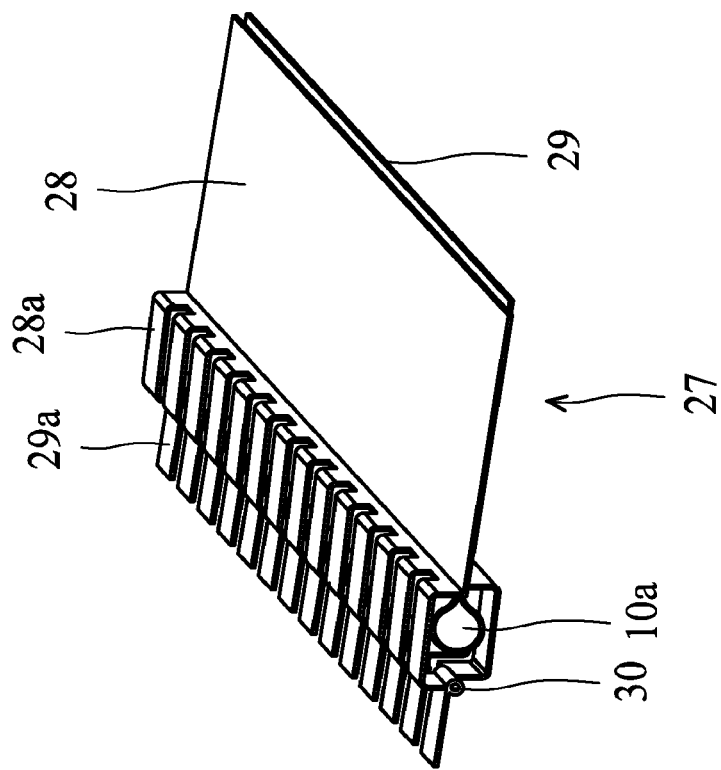
FIGS. 6A-6B show a perspective view of another 'book' or 'wrap' embodiment in a storage position (FIG. 6A) and an open position (FIG. 6B), respectively, in accordance with the invention.
Figure 6B:
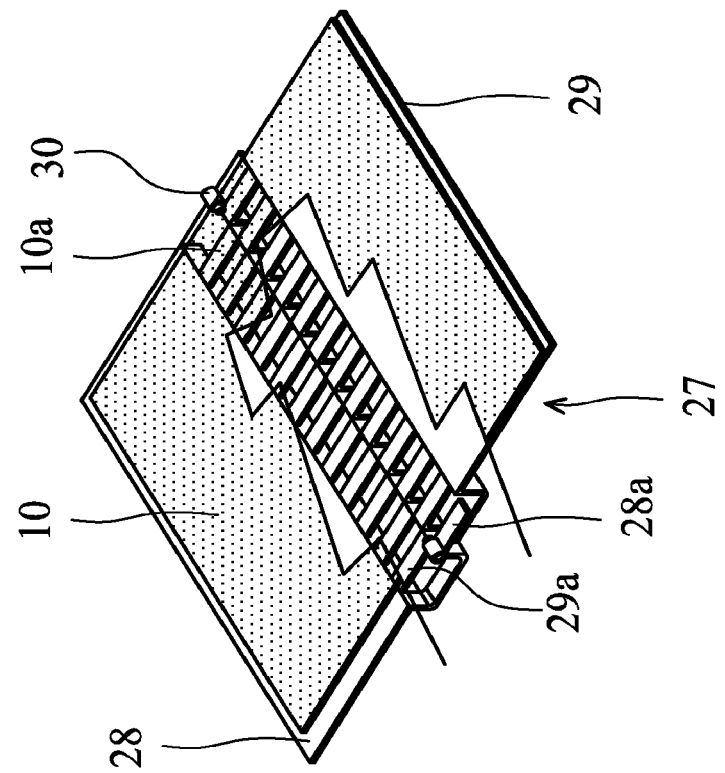

The embodiment shown in FIGS. 6A-6B is a 'book' or 'wrap' display system 27. Each of the two main display supports 28, 29 comprises a number of extended teeth like parts 28a, 29a, extending parallel to each other and perpendicular to a hinge axis 30 between the display supports 28, 29. Due to the mutually offset positioning of the parts 28a, 29a, when opening the system, from the position of FIG. 6A the extended parts 28a, 29a are rotated around the axis 30 and moved to a planar configuration, supporting as an additional display support in the position of FIG. 6B the display segment 10a for touch events.

Figure 8B:
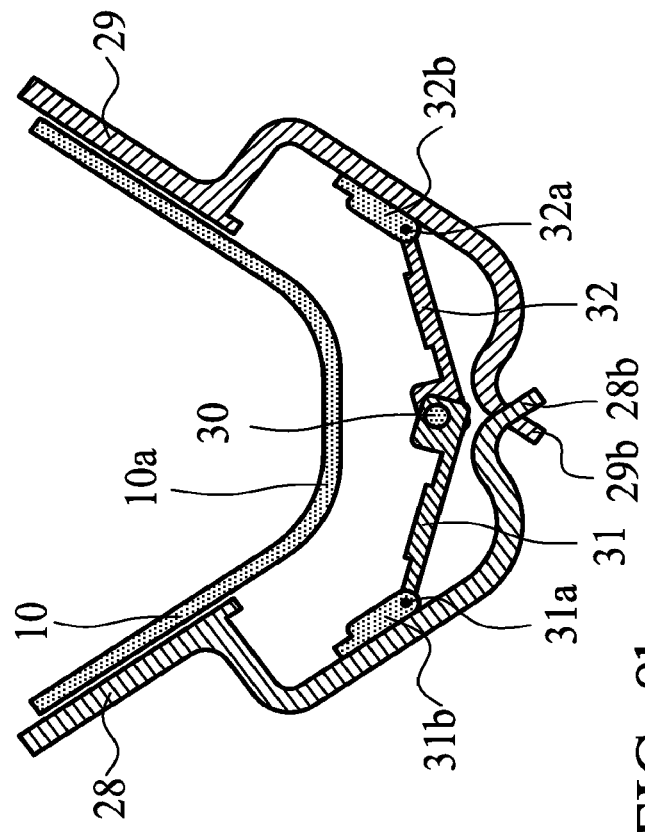
FIGS. 8A-8C show a schematic side view of a part of the 'book' embodiment of FIGS. 7A-7B in a storage position (FIG. 8A), an a partial open position (FIG. 8B) and open position (FIG. 8C), respectively, in accordance with the invention.
Figure 8A:
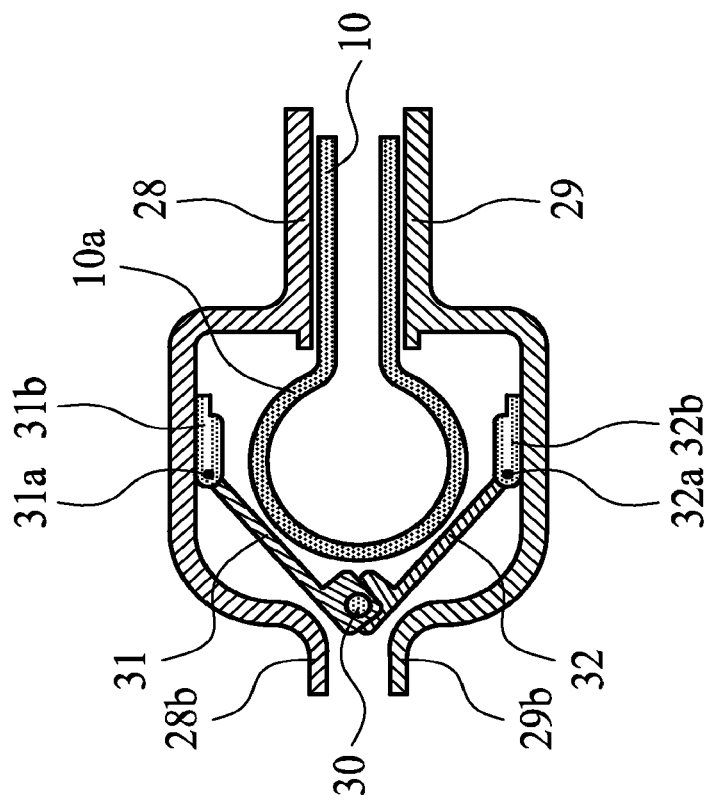
Figure 8C:
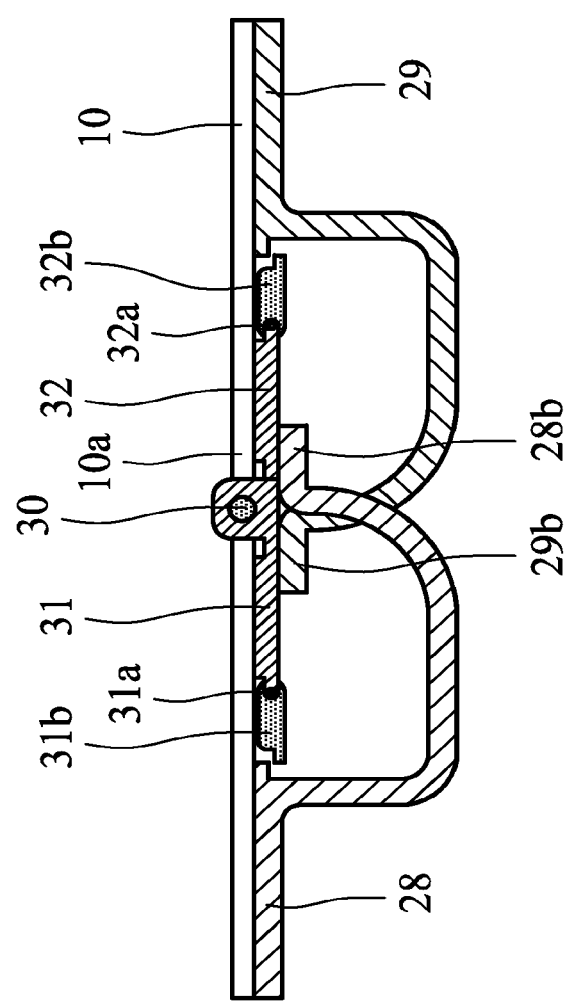

In the embodiment shown in FIGS. 7A-7B the display system 27 has a construction with parts 23b, 29b, used comparable with the extended main display supports parts embodiment of FIGS. 6A-6B. However a combination of two connected flat panels 31, 32, rotatable around the axis 30, inside main display supports 28, 29 is added as an additional display support for touch support. In the closed state these parts 28b, 29b are positioned as shown in FIG. 7A. The flexible display 10 has the free space to form a partial curvature without conflicting with the panels 31, 32. Upon opening the two main displays supports 28, 29, the extended parts 28h, 29h push and support the supporting flat panels 31, 32 to the flat position as shown in FIG. 7B. The detailed transition from the closed position of FIG. 8A is shown in FIGS. 8B and 8C. By pivots 31a, 32a the panels 31, 32 are connected with panel parts 31b, 32b. For ensuring stable end positions this connection may be spring loaded.

Between the two flat panels 31, 32 the angle of rotation can be limited so that in open state the panels 31, 32 and their parts 31b, 32b are parallel and therefore support the flexible display segment 10a in the region of the hinge mechanism, see FIG. 8C. In the opened position the panels 31, 32 may fully support the display segment 10a or be located (as shown in FIG. 8C) with a minimal play under the display segment in order to be able to compensate tolerances in the support mechanism.

It is noted that alternatively the two panels 28, 29 are integrated into one plastic panel with a living hinge at the location of the 30.

The embodiment shown in FIGS. 9A-9F is a 'book' display system 9 comparable with that of FIGS. 3A-3I and FIGS. 4A-4F. In this embodiment the display segment 10a is supported by additional display supports comprising a central support plate 33 and two hingeably connected display support plates 34, 35. The central support plate 33 is used as dual guided hinge part for the two display supports 11, 12 of the system by gear sets 36, 37. Alternatively (not shown) the central additional support plate 33 is separated from the two device halves in which case it is only attached to the two display support plates 34, 35, with a guidance for the central support plate 33.

Figure 9D:
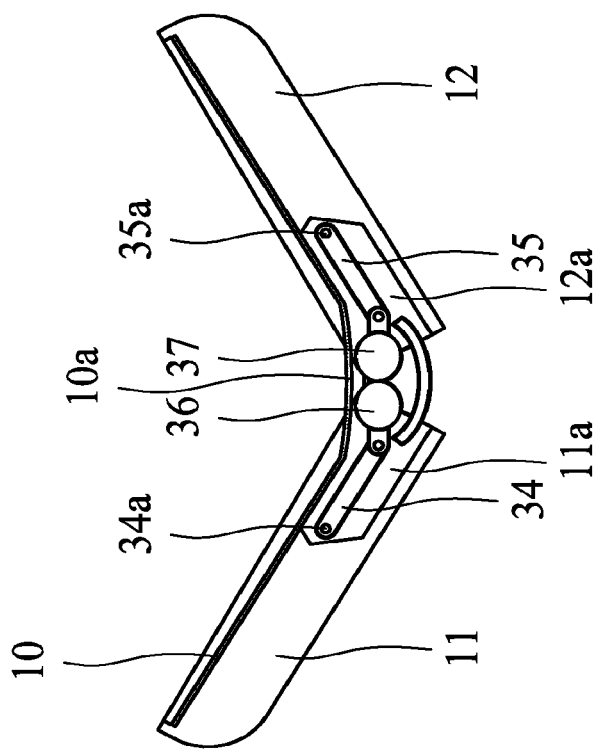
Figure 9C:
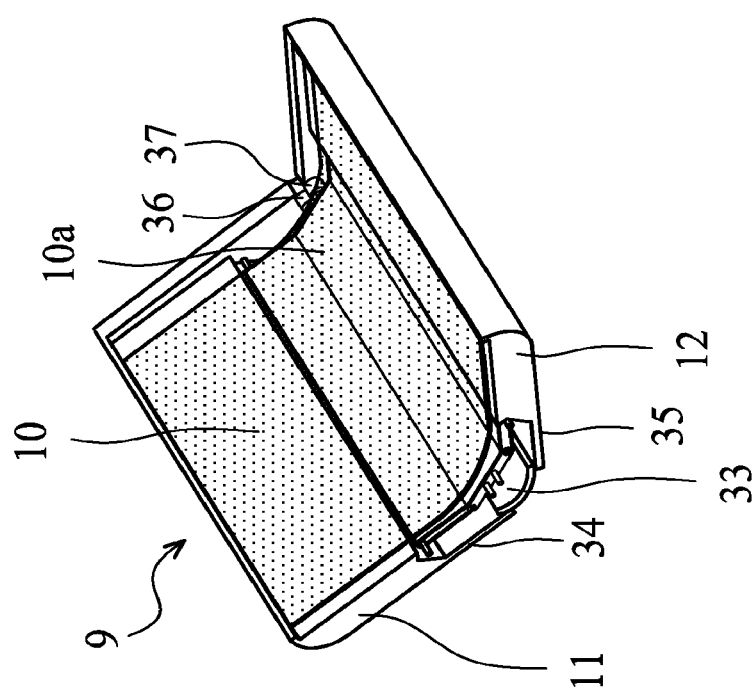
Figure 9F:
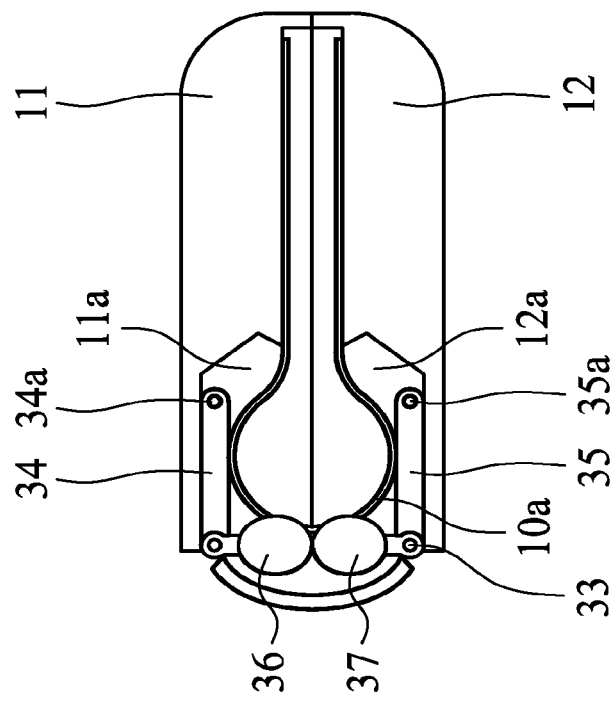
Figure 9E:
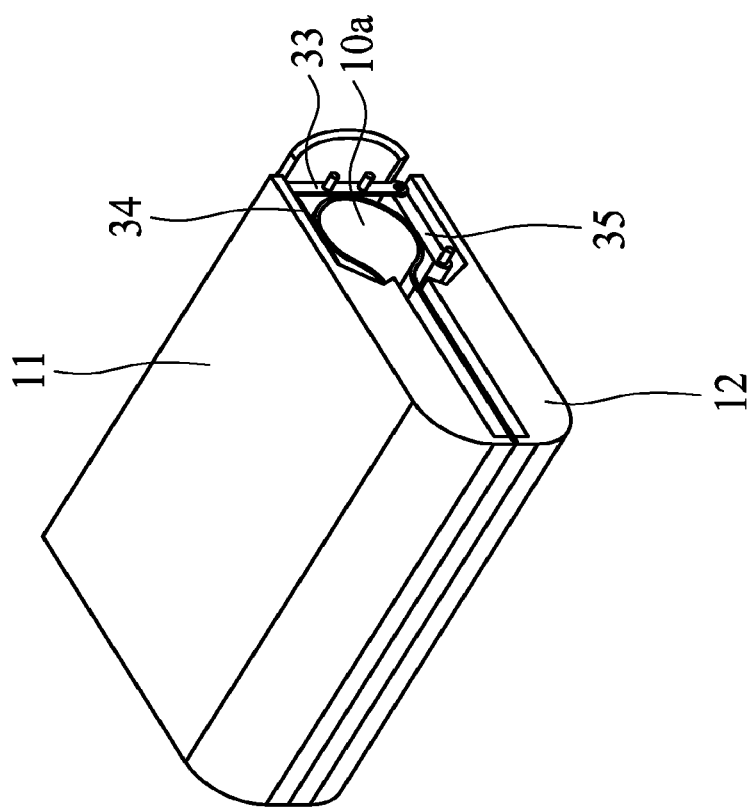

The support plates 34, 35 each have a pin 34a, 35a that is guided in a slot 11a, 12a in each of the display supports 11, 12 of the device body. These slots 11a, 12a guide the movement of the plates 34, 35 in such a manner that in open position of FIGS. 9A and 9B the display segment 10a is completely supported and in closed position of FIGS. 9E and 9F the curved display segment 10a is not obstructed. FIGS. 9C and 9D show an intermediate situation. Preferably in the closed position the plates 33, 34 and 35 facilitate by their positioning a predefined curvature of the display segment 10a with the advantages described before for the embodiment of FIGS. 2A-2E.

Figure 10A:
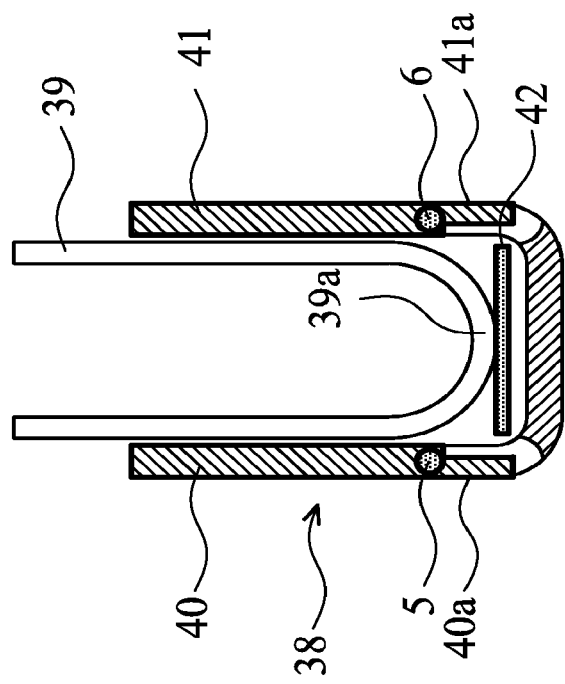
FIGS. 10A-10B show a schematic side view of a part of still another 'book' or 'wrap' embodiment in a storage position (FIG. 10A) and open position (FIG. 10B), respectively, in accordance with the invention.
Figure 10B:
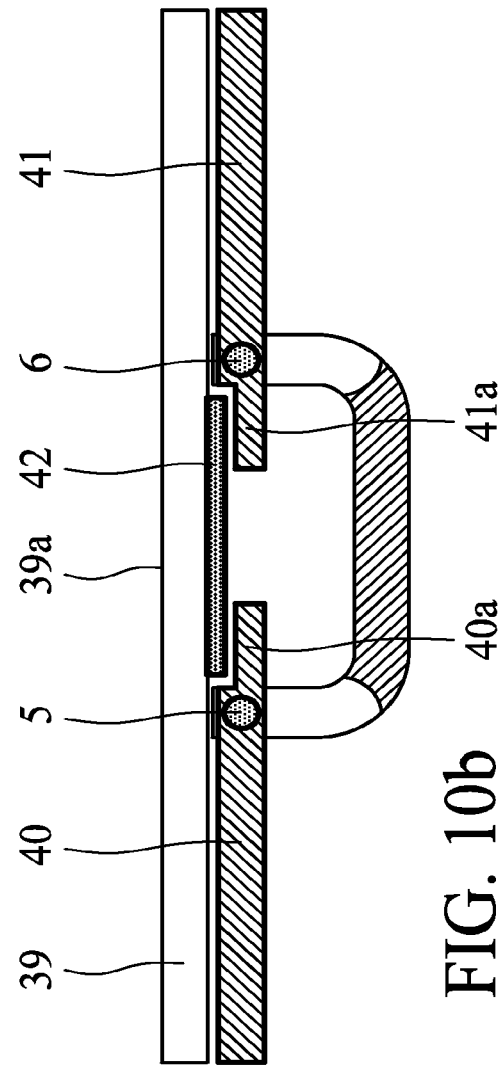

The embodiment shown in FIGS. 10A-10B is a 'book' or 'wrap' display system 38 with a flexible display 39, a display segment 39a and main display supports 40, 41. These main supports are hingeably connected via hinges 5, 6 like the supports in the embodiment of FIGS. 2A-2E. In this embodiment the additional display support comprises a support strip 42 which is connected to the display segment 39a. The main display supports 40, 41 are provided with hooks 40a, 41a and push with the hooks during their movement from the storage position to the open position the support strip 42 with the display segment 39a to the flat position. In the open position the gap created by the hinge mechanism of hinges 5, 6 between the main supports 40, 41 is closed by the display support strip 42 and substantially the whole surface of the display is supported. Preferably in the closed position the support strip 42 facilitates by its positioning a predefined curvature of the display segment 10a in a way as described before for the embodiment of FIGS. 2A-2E.

Figure 11B:
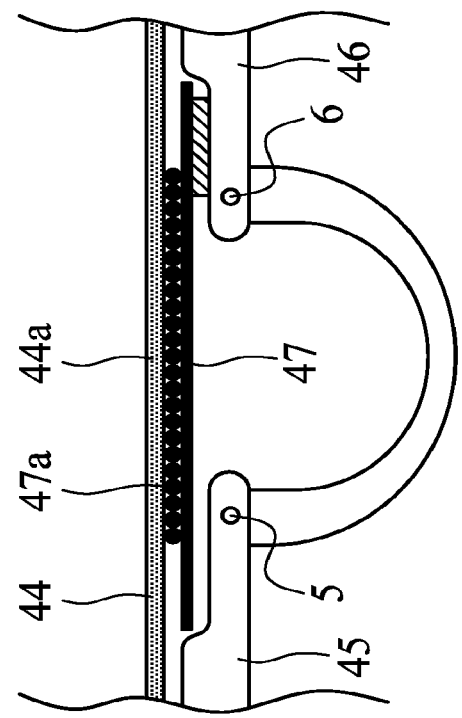
FIGS. 11A-11B show a schematic side view of part of another 'book' or 'wrap' embodiment in a storage position (FIG. 11A), and open position (FIG. 11B), respectively, in accordance with the invention.
Figure 11A:
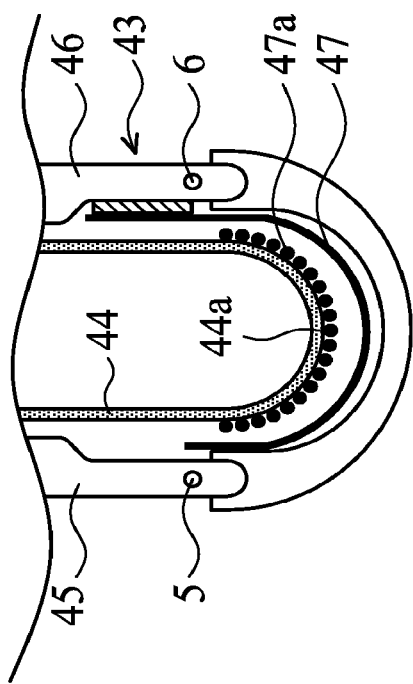

The embodiment shown in FIGS. 11A and 11B is a 'book' or 'wrap' display system 43 with a flexible display 44 and main display supports 45, 46 which are hingeably connected via hinges 5, 6 like the supports in the embodiment of FIGS. 2A-2F. In this embodiment, instead of the foil 3, the additional display support comprises near both sides of the display a strip of spring tape 47, cooperating with rods 47a. The tape 47 may be of the kind of spring steel measuring tape, or alternatively a plastic spring tape. These rods 47a are of the kind disclosed in WO 2009/143313 A1 (herewith incorporated by reference) and close in the open position of FIG. 11B, supported by the tape 47, the gap created by the hinge mechanism of hinges 5, 6 between the main supports 45, 46 and support substantially the whole surface of the display segment 44a in a flat position.

The display system 48 schematically shown in FIGS. 12A-12D is a 'roll' embodiment of the kind as disclosed in WO 2006/038171 A1 (herewith incorporated by reference). In the embodiment shown in FIG. 12A, both a rollable flexible display 49 and a pre-tensioned rolled foil 50 are provided with a spring 49a, 50a, respectively, on the inside of their roll and accommodated in a housing 51. The ends of the flexible display 49 and the foil 50 are connected at a hold out mechanism 52 (only shown with its connection wall), enabling a common rolling out of both the display and the foil. In the open position preferably the force $f_2$ of the pre-tensioned foil spring 50a is greater than the force $f_1$ of the display spring 49a. These forces are indicated by the length of the arrows. In this way in the open position the rollable display is provided with an additional display support acting over its surface as an effective touch-support.

Figure 12A:
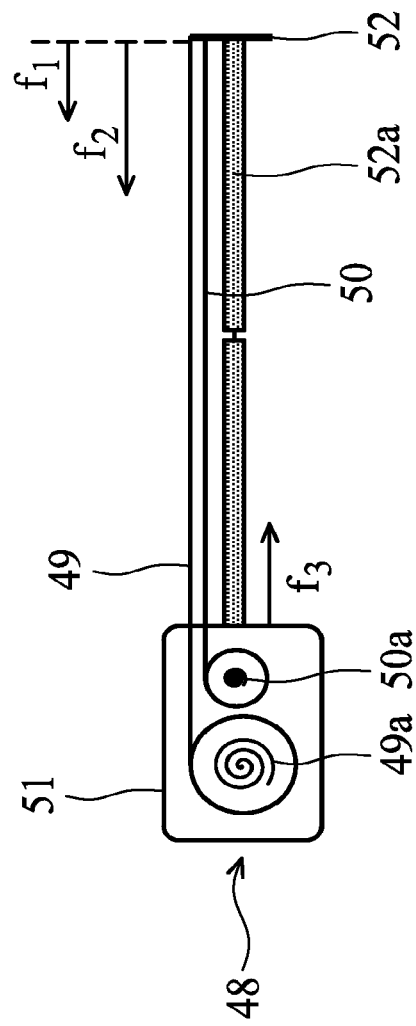
FIGS. 12A-12D show a schematic side view of part of a 'roll' embodiment in an open position in four versions (FIGS. 12A, 12B, 12C and 12D) in accordance with the invention.
Figure 12B:
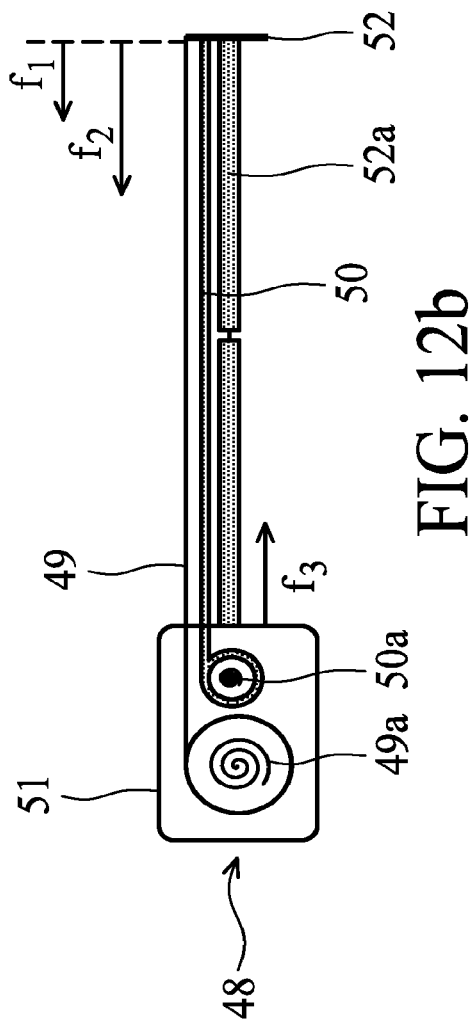
Figure 12C:
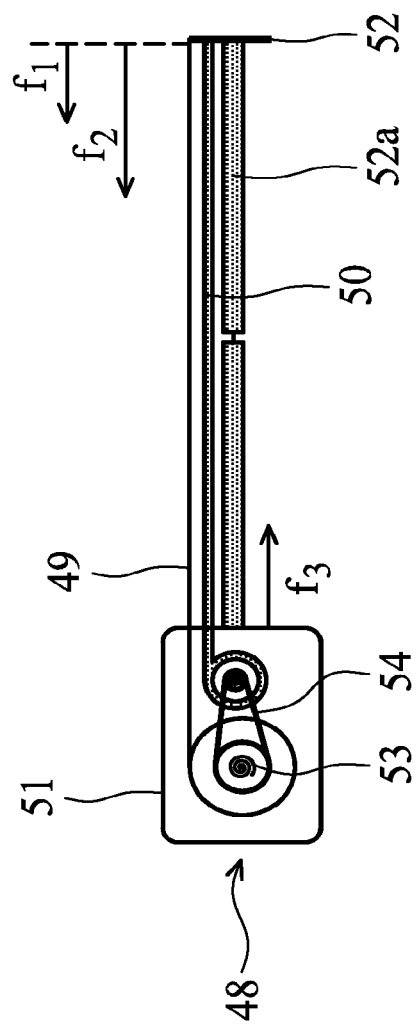

In FIGS. 12B and 120 similar embodiments are shown but with a different kind or thickness of foil 50 to achieve different levels of support. Also is shown that a force $f_2$ smaller than and/or equal to $f_1$ could be possible as well, depending on desired level of support.

In the embodiment of FIG. 120 only one spring 53 is used, provided in the display roll 49, further using a gear belt 54 or a gear set (not shown) for linking the two rolls 49, 50. In the last case the gear ratio needs to account for any differences in radius between the two rolls.

Figure 12D:
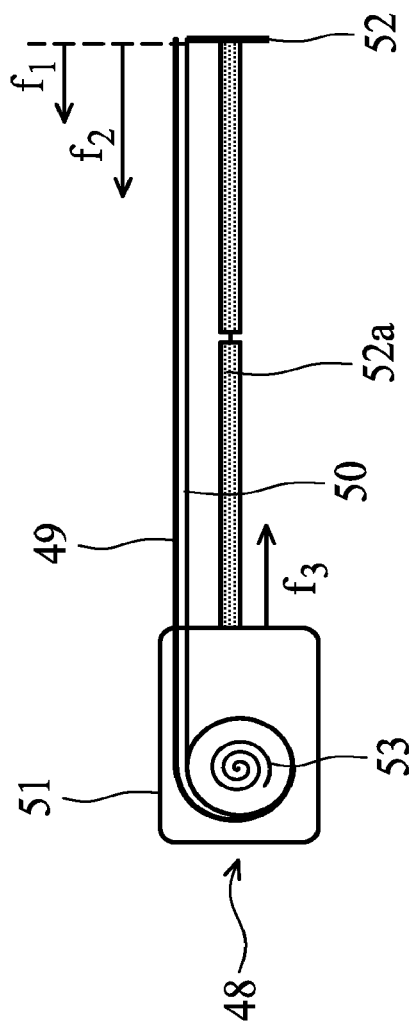

In the embodiment of FIG. 12D is shown the combination of the flexible display 49 and the foil 50 in a single roll with only one spring 53. Thus the dimensions of the housing 51 may be limited.

In the embodiments of FIGS. 12A-12D a flexible display 49 is extended using a linear actuation mechanism 52a not further described here and of the kind as for example disclosed in WO 2006/038171 A1, which also functions as the hold out mechanism 52, such that in extended position the force $f_2$ exerted by the hold out mechanism 52 is equal to the forces of the pre-tensioned foil 50 and the flexible display 49 added together hut oriented in the opposite direction.

Figure 13C:
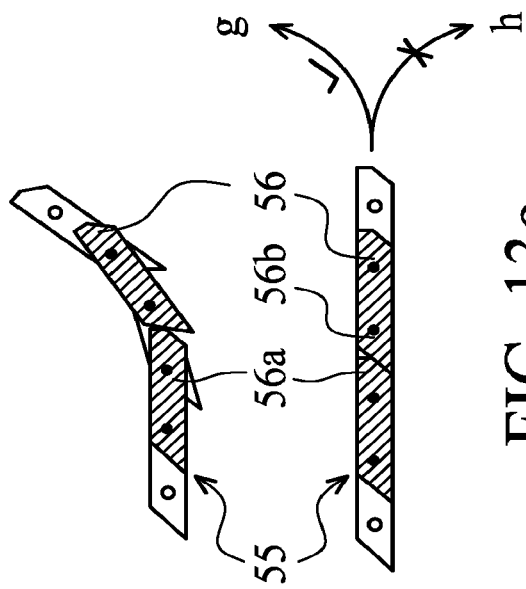
FIGS. 13A-13C show a schematic side view of an additional display support of another 'book' or 'wrap' embodiment in a storage position (FIG. 13A) and an open position (FIG. 13B), as well as the positioning of the additional display support (FIG. 13C), respectively, in accordance with the invention.
Figure 13A:
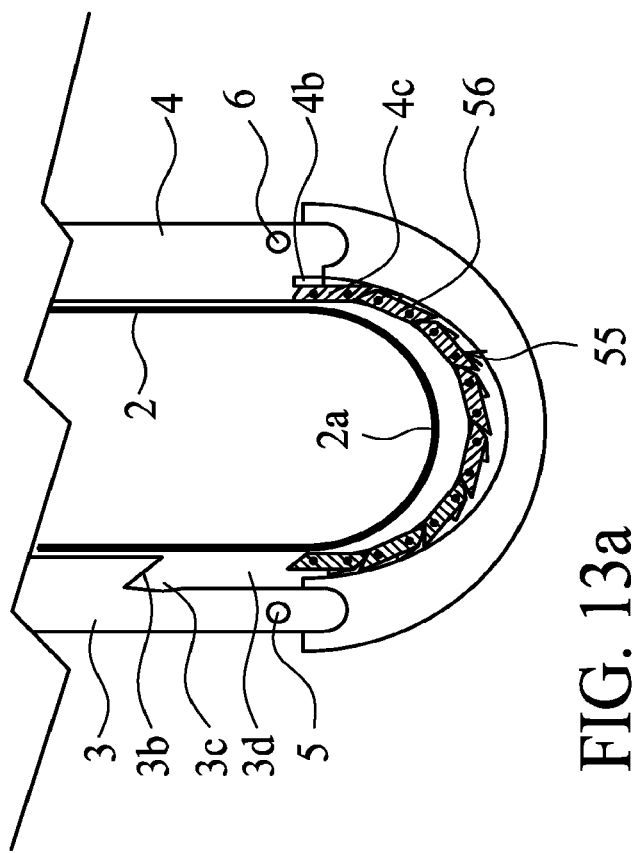
Figure 13B:
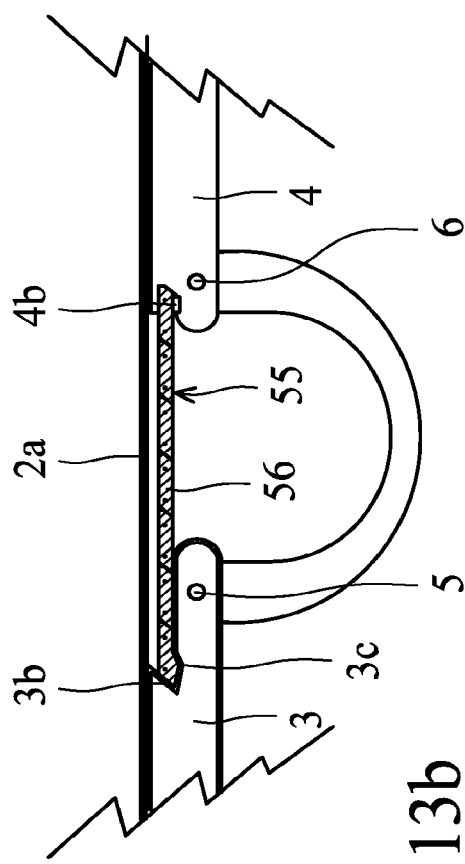

An alternative solution in a display system for an additional display support 55 for the preceding 'book' or 'wrap' embodiments is shown in FIGS. 13A-13C for the embodiment of FIGS. 2A-2E in a storage position (FIG. 13A) and in an open flat position (FIG. 13B), respectively. This solution uses a number of specially designed segments 56, inter-linked by hinges 56a. An end segment 56 is coupled by a pivot 4c with the display support 4 and an abutment 4b limits the pivotal movement of this end segment. These segments are substantially parallelogram-shaped with one rounded corner 56b and are mutually configured such that when a segment 56 is locally bent to a radius, its inter-linkage will make sure that other segments follow (see arrow g in FIG. 13C). The local radius can therefore never become small. The configuration and inter-linkage of the segments prevent that a segment 56 is bent in the direction of the arrow h in FIG. 13C. During the movement from the position shown in FIG. 13A to the flat position shown in FIG. 13B all segments 56 are pushed flat by their configuration and inter-linkage. A stable positioning towards the flat position of the segments is supported due to the length of the gap 3d between the flexible display 2 and the support 3. In addition, in the position shown in FIG. 13A at the left side of the gap 3d an end segment 56 may be stably positioned in an optional hook shaped recess 3b in the support 3. Further in addition, in the area of the gap 3d an optional recess 3c in the support may be applied for extra stabilization of the flat position of the segments 56. Due to this stable positioning the flat position of the whole additional support 55 is ensured. In the flat position the combined segments 56 support substantially the whole surface of the display segment 2a in an effective way.

It is noted that in addition a spring (not shown) may be applied between the left side segment 56 and the support 3, urging the end segment 56 into the gap 3d towards its end position.

The minimum achievable radius of the curvature will be determined by the positioning of the individual hinges 56a, the design of end stops near the corners of the segments and the distance between hinge points. This enables in the storage position a facilitation of the curvature of the display segment 2a with a predefined curvature, in this embodiment shown as a combination of circular arches.

The detailed drawings, specific examples and particular formulations given, serve the purpose of illustration only. Furthermore, other substitutions, modifications, changes, and omissions may be made in the design, operating conditions, and arrangement of the exemplary embodiments without departing from the scope of the invention as expressed in the appended claims.

The invention claimed is:

1. A display device comprising:
   a flexible display comprising a first portion, a second portion, and a third portion between the first portion and the second portion;
   a first display support supporting the first portion of the flexible display;
   a second display support supporting the second portion of the flexible display; and
   a flexible support continuously supporting the third portion of the flexible display in a closed position and an open position;
   wherein the flexible support comprises a plurality of rods supporting the third portion of the flexible display,
   wherein the first display support and the second display support are rotatably connected to a first hinge and a second hinge, respectively,
   wherein when the flexible display is in the open position, the flexible display is contacted and supported by the first display support, the second display support and the flexible support, and
   wherein, when the flexible display is in the open position, the plurality of rods are positioned under a surface of the third portion of the flexible display and over both the first hinge and the second hinge.

2. The display device of claim 1, wherein the flexible support facilitates a curved portion of the flexible display in the closed position.

3. The display device of claim 1, wherein both end portions of the flexible support are rolled with the first hinge and the second hinge in the open position such that the flexible support is stretchable to support the third portion of the flexible display.

4. The display device of claim 1, further comprising:
   a spring tape supporting the plurality of rods when the flexible display is in the open position, and
   wherein an end portion of the spring tape is connected to at least one of the first display support and the second display support.

5. The display device of claim 4, wherein when the flexible display is in the open position, a gap is created between the plurality of rods and the spring tape.

\* \* \* \* \*